(12) United States Patent
Maeng et al.

(10) Patent No.: US 12,733,202 B2
(45) Date of Patent: Sep. 8, 2026

(54) TRANSISTOR

(71) Applicant: SAMSUNG ELECTRONICS CO., LTD., Suwon-si (KR)

(72) Inventors: Wooyeol Maeng, Hwaseong-si (KR); Hyungjin Lee, Seoul (KR); Huichul Shin, Uijeongbu-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 698 days.

(21) Appl. No.: 18/092,246

(22) Filed: Dec. 31, 2022

(65) Prior Publication Data

US 2023/0261106 A1 Aug. 17, 2023

(30) Foreign Application Priority Data

Feb. 16, 2022 (KR) ........................ 10-2022-0019976

(51) Int. Cl.
*H10D 30/65* (2025.01)
*H10D 30/01* (2025.01)
(Continued)

(52) U.S. Cl.
CPC ......... *H10D 30/65* (2025.01); *H10D 30/0281* (2025.01); *H10D 30/6211* (2025.01);
(Continued)

(58) Field of Classification Search
CPC ......... H10D 62/156–157; H10D 62/15; H10D 62/105; H10D 30/6713–6717; H10D 64/665–667; H10D 64/6471; H10D 30/0221; H10D 30/603; H10D 30/0218; H10D 30/022; H10D 62/106; H10D 62/114; H10D 30/0227; H10D 30/0217; H10D 84/0149; H10D 84/0186; H10D 84/0188; H10D 84/929–933; H10D 84/991–992;
(Continued)

(56) References Cited

U.S. PATENT DOCUMENTS 6,951,793 B2 * 10/2005 Shih .................. H10D 30/6715
438/303
8,546,252 B2 10/2013 Anderson et al.
(Continued)

*Primary Examiner* — Julio J Maldonado
*Assistant Examiner* — Eric Manuel Mulero Flores
(74) *Attorney, Agent, or Firm* — Morgan, Lewis & Bockius LLP

(57) ABSTRACT

A transistor includes a substrate including a P-type-sub region doped with P-type impurities, a well region positioned at an upper portion of the substrate and doped with P-type impurities, a gate structure on the well region, and drain and source regions. The gate structure includes a gate insulation layer, first and second conductive patterns for adjusting a threshold voltage and a gate electrode. The drain and source regions are positioned at an upper portion of the substrate adjacent first and second sidewalk of the gate structure, respectively. The source region is doped with N-type impurities. The drain region includes a highly doped N-type impurity region, an N-type impurity region, and a lightly doped P-type impurity region sequentially disposed in a downward direction from a top surface of the substrate. A boundary between the well region and the P-type sub region is positioned under a bottom of the drain region.

18 Claims, 17 Drawing Sheets

(51) Int. Cl.

| | |
|---|---|
| ***H10D 30/62*** | (2025.01) |
| ***H10D 62/13*** | (2025.01) |
| ***H10D 64/01*** | (2025.01) |
| ***H10D 64/66*** | (2025.01) |
| ***H10P 30/20*** | (2026.01) |

(52) U.S. Cl.
CPC ..... *H10D 62/157* (2025.01); *H10D 64/01318* (2026.01); *H10D 64/017* (2025.01); *H10D 64/667* (2025.01); *H10P 30/204* (2026.01); *H10P 30/21* (2026.01)

(58) Field of Classification Search
CPC . H10D 30/0223–0229; H10D 30/0278; H10D 30/795; H10D 62/113; H10D 62/115; H10D 62/299; H10D 84/0191; H10D 84/858–859; H10D 30/0281; H10D 30/65; H10D 30/655; H10D 30/6219; H10D 62/159; H10D 62/124–125; H10D 62/351–364; H10D 62/393; H10D 84/835
See application file for complete search history.

(56) References Cited

U.S. PATENT DOCUMENTS

| | | | | |
|---|---|---|---|---|
| 8,755,157 | B2 | 6/2014 | Son et al. | |
| 9,006,055 | B2 | 4/2015 | Xiao et al. | |
| 9,601,594 | B2 * | 3/2017 | Wu | H10D 62/021 |
| 9,640,523 | B2 | 5/2017 | Cai et al. | |
| 10,505,007 | B1 * | 12/2019 | Su | H10D 84/0142 |
| 10,916,652 | B2 | 2/2021 | Lee | |
| 2004/0132249 | A1 * | 7/2004 | Mitsuda | H10D 30/791 257/E21.336 |
| 2006/0220115 | A1 * | 10/2006 | Otake | H10D 62/158 257/E27.06 |
| 2008/0197412 | A1 * | 8/2008 | Zhang | H10D 62/151 257/E21.409 |
| 2012/0175703 | A1 * | 7/2012 | Park | H10D 64/671 257/E29.256 |
| 2015/0295081 | A1 * | 10/2015 | Matsuda | H10D 30/0221 257/339 |
| 2017/0148792 | A1 * | 5/2017 | Kim | H10D 64/513 |
| 2020/0259018 | A1 | 8/2020 | Rami et al. | |
| 2021/0305425 | A1 | 9/2021 | Hatakenaka | |

* cited by examiner

TRANSISTOR

CROSS-REFERENCE TO RELATED APPLICATION

This application claims priority under 35 USC § 119 to Korean Patent Application No. 10-2022-0019976, filed on Feb. 16, 2022 in the Korean Intellectual Property Office, the disclosure of which is incorporated by reference in its entirety herein.

1. Technical Field

Embodiments of the present disclosure relate to a transistor. More particularly, embodiments of the present disclosure relate to a high voltage power transistor.

2. Discussion of Related Art

An LDMOS (Lateral Double-diffused Metal Oxide Semiconductor) transistor may be used in high voltage power transistors. When a bias is applied to each of a gate electrode and a drain region of the LDMOS transistor, a resistance of a surface of a substrate may be relatively low, and a resistance in a bulk region of the substrate may be relatively high. Thus, in the LDMOS transistor, most of the on currents may flow along the surface of the substrate. Further, electric fields may be concentrated at a region around a sidewall of the drain region adjacent to the surface of the substrate. When the electric fields are concentrated in the drain region, a characteristic of a breakdown voltage may be poor and the breakdown voltage may be lowered. An increase in the length of a drift region of the LDMOS transistor may provide a relatively high breakdown voltage and a high reliability. However, as the length of the drift region of the LDMOS transistor increases, a horizontal area of the substrate on which the transistor is formed may be increased. It is desired to provide a high voltage power transistor having a high breakdown voltage without increasing the length of the drift region.

SUMMARY

Embodiments of the present disclosure provide a high voltage power transistor having good electrical characteristics and a high reliability.

According to an embodiment of the present disclosure, a transistor includes a substrate having a bulk region including a P-type-sub region that is doped with P-type impurities. A well region is positioned at an upper portion of the substrate. The well region is doped with P-type impurities. A gate structure is on the well region. The gate structure includes a gate insulation layer, a first conductive pattern for adjusting a threshold voltage, a second conductive pattern for adjusting a threshold voltage, and a gate electrode. A drain region is positioned at an upper portion of the substrate adjacent to a first sidewall of the gate structure. A source region is doped with N-type impurities and is positioned at an upper portion of the substrate adjacent to a second sidewall of the gate structure. The second sidewall of the gate structure facing the first sidewall of the gate structure. The drain region includes a highly doped N-type impurity region, an N-type impurity region having a lower N-type impurity concentration than the highly doped N-type impurity region, and a lightly doped P-type impurity region sequentially disposed in a downward direction from a top surface of the substrate towards a bottom surface of the substrate. A boundary between the well region and the P-type-sub region is positioned under a bottom of the drain region.

According to an embodiment of the present disclosure, a transistor includes a substrate having a bulk region including a P-type-sub region that is doped with P-type impurities. A well region is positioned at an upper portion of the substrate. The well region is doped with P-type impurities. An insulating interlayer is on the substrate. The insulating interlayer includes a gate trench exposing an upper surface of the well region. A gate structure is in the gate trench. A drain region is positioned at an upper portion of the substrate adjacent to a first sidewall of the gate structure. The drain region has a doping concentration of impurities that decreases in a downward direction from the upper surface of the substrate towards a bottom surface of the substrate. A source region is doped with N-type impurities and is positioned at an upper portion of the substrate adjacent to a second sidewall of the gate structure. The second sidewall of the gate structure faces the first sidewall of the gate structure. The gate structure includes a gate insulation layer on a sidewall and a bottom of the gate trench. A first conductive pattern for adjusting a threshold voltage on the gate insulation layer is in a first portion of the gate trench. The first conductive pattern for adjusting the threshold voltage has a first thickness. A second conductive pattern for adjusting a threshold voltage is on the gate insulation layer in a second portion of the gate trench that is different from the first portion. The second conductive pattern for adjusting the threshold voltage has a second thickness that is different from the first thickness. A gate electrode is on the first and second conductive patterns for adjusting the threshold voltage. A boundary between the well region and the P-type-sub region is positioned under a bottom of the drain region.

According to an embodiment of the present disclosure, a transistor includes active fins protruding from a substrate. An isolation pattern fills a lower portion between the active fins. A P-type-sub region is in each of the active fins. The P-type-sub region is doped with P-type impurities. A well region is at an upper portion of each of the active fins. The well region is doped with P-type impurities. A gate structure is on surfaces of the active fins on the well region. The gate structure includes a gate insulation layer, a first conductive pattern for adjusting a threshold voltage, a second conductive pattern for adjusting a threshold voltage, and a gate electrode. Each of the active fins includes a drain region adjacent to a first sidewall of the gate structure. Each of the active fins includes a source region doped with N-type impurities and positioned adjacent to a second sidewall of the gate structure. The second sidewall of the gate structure faces the first sidewall of the gate structure. The drain region includes a highly doped N-type impurity region, an N-type impurity region having a lower N-type impurity concentration than the highly doped N-type impurity region, and a lightly doped P-type impurity region sequentially disposed in a downward direction from a top of the active fin towards a bottom surface of the active fin. A boundary between the well region and the P-type-sub region is positioned under a bottom portion of the drain region.

The transistor in accordance with embodiments may have a low threshold voltage at a portion of the gate structure adjacent to the drain region, and thus may have a high-frequency operation characteristic. Further, in the transistor, a P-N junction region having a high-concentration may be decreased, so that the transistor may have a characteristic of a high breakdown voltage to provide an increased reliability.

BRIEF DESCRIPTION OF THE DRAWINGS

Embodiments of the present disclosure will be more dearly understood from the following detailed description taken in conjunction with the accompanying drawings.

FIG. 1 is a cross-sectional view illustrating a high voltage power transistor according to an embodiment of the present disclosure;

FIGS. 2 to 11 are cross-sectional views illustrating a method of manufacturing a high voltage power transistor according to embodiments of the present disclosure;

FIG. 12 is a cross-sectional view illustrating a high voltage power transistor according to an embodiment of the present disclosure;

FIG. 13 is a perspective view illustrating a high voltage power transistor according to an embodiment of the present disclosure;

FIG. 14 is a perspective view illustrating an active fin in the high voltage power transistor shown in FIG. 13 according to an embodiment of the present disclosure;

FIG. 15 is a cross-sectional view illustrating a high voltage power transistor according to an embodiment of the present disclosure;

FIG. 16 is a cross-sectional view illustrating a high voltage power transistor according to an embodiment of the present disclosure;

FIG. 17 is a perspective view illustrating a high voltage power transistor according to an embodiment of the present disclosure;

FIGS. 18 and 19 are a plan view and a cross-sectional view illustrating a high voltage power transistor according to embodiments of the present disclosure;

FIGS. 20 and 21 are a plan view and a cross-sectional view illustrating a high voltage power transistor according to embodiments of the present disclosure;

FIG. 22 is a cross-sectional view illustrating a high voltage power transistor according to an embodiment of the present disclosure;

FIG. 23 is a cross-sectional view illustrating a high voltage power transistor in according to an embodiment of the present disclosure;

FIG. 24 is a cross-sectional view illustrating a high voltage power transistor in accordance with example embodiments;

FIG. 25 is a cross-sectional view illustrating a high voltage power transistor according to an embodiment of the present disclosure;

FIG. 26 is a cross-sectional view illustrating a high voltage power transistor according to an embodiment of the present disclosure; and FIG. 27 is a cross-sectional view illustrating a high voltage power transistor according to an embodiment of the present disclosure.

DESCRIPTION OF EMBODIMENTS

Figure 1:
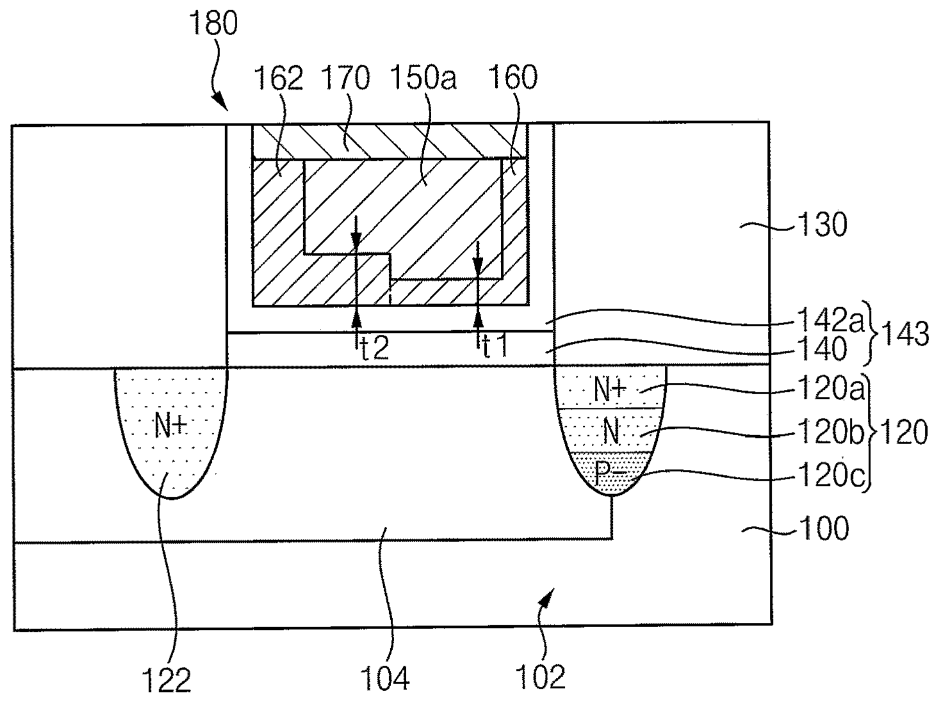
FIGS. 1 to 27 represent non-limiting embodiments as described herein.

FIG. 1 is a cross-sectional view illustrating a high voltage power transistor in accordance with an embodiment of the present disclosure.

Hereinafter, the high voltage power transistor is described as an N-type transistor. However, in an embodiment in which impurities having an opposite conductivity type are doped at each of impurity regions, a high voltage power transistor may be provided as a P-type transistor.

Referring to FIG. 1, a substrate 100 may include a single crystal silicon wafer. In an embodiment, the substrate 100 may be a wafer including germanium, silicon-germanium, or a III-V compound such as GaP, GaAs, or GaSb. In some embodiments, the substrate 100 may be a silicon-on-insulator (SOI) wafer or a germanium-on-insulator (GOI) wafer.

A gate structure 180 may be disposed on the substrate 100. A source region 122 and a drain region 120 may be disposed at an upper portion of the substrate 100 adjacent to both sides of the gate structure 180.

In an embodiment, a bulk region of the substrate 100 may be a p-type sub region 102 doped with p-type impurities having a low concentration. A P-well region 104 may be positioned at the upper portion of the substrate 100. The P-well region 104 may be positioned to overlap at least an entirety of a lower surface of the gate structure 180. The P-well region 104 may serve as a well region for flowing drift currents in the high voltage power transistor. The P-well region 104 may be doped with P-type impurities.

The drain region 120 may be disposed at an upper portion of the substrate 100 adjacent to a first sidewall of the gate structure 180.

The drain region 120, a doping concentration of impurities may gradually decrease downwardly from an upper surface of the substrate 100 in a direction towards a lower surface of the substrate 100. The drain region 120 may include portions having different conductivity type. In the drain region 120, a conductivity type of impurities in a lowermost portion may be different from a conductivity type of impurities in an upper portion on the lowermost portion. In an embodiment, the drain region 120 may include an N-type impurity region positioned at the upper portion and a P-type impurity region positioned at the lowermost portion.

For example, the drain region 120 may include a highly doped N-type impurity region 120*a* (N+ in FIG. 1), an N-type impurity region 120*b* (N in FIG. 1), and a lightly doped P-type impurity region 120*c* (P− in FIG. 1). The highly doped N-type impurity region 120*a*, the N-type impurity region 120*b*, and the lightly doped P-type impurity region 120*c* may be sequentially disposed in a downward direction from the upper surface of the substrate 100 towards the lower surface of the substrate 100. An impurity concentration of the N-type impurity region 120*b* may be lower than an impurity concentration of the highly doped N-type impurity region 120*a*.

The doping concentration of the drain region 120 may gradually decrease in a downward direction from the upper surface of the substrate 100, so that electric fields applied to the drain region 120 may be decreased toward an inner portion of the substrate 100. Therefore, when the high voltage power transistor is operated, hot carrier injection may be decreased. Thus, a reliability failure may be decreased and the high voltage power transistor may have an increased reliability.

At least a portion of a lower interface of the drain region 120 may directly contact the P-well region 104, and a remaining portion of the lower interface of the drain region 120 may directly contact the P-type sub region 102. A boundary between the P-well region 104 and the P-type sub region 102 may be positioned under a bottom of the drain region 120.

Since the lightly doped P-type impurity region 120*c* is positioned at a lower portion of the drain region 120, a bottom of the lightly doped P-type impurity region 120*c* may directly contact each of the P-well region 104 and the P-type sub region 102. Since all of the lightly doped P-type impurity region 120*c*, the P-well region 104 and the P-type sub region 102 are lightly doped with p-type impurities, a difference between impurity concentrations at boundaries of the lightly doped P-type impurity region 120*c*, the P-well region 104, and the P-type sub region 102 may be relatively small.

An entire interface of the drain region 120 may not directly contact the P-well region 104, and only a partial interface of the drain region 120 may directly contact the P-well region 104. For example, only the partial interface of the drain region 120 facing the source region 122 may directly contact the P-well region 104. Therefore, a P-N junction region having a high-concentration in the high-voltage power transistor may be decreased, so that a concentration of electric fields may be decreased. Thus, the high voltage power transistor may have a characteristic of a high breakdown voltage for providing an increased reliability.

The source region 122 may be positioned at the upper portion of the substrate 100 adjacent to a second sidewall facing the first sidewall of the gate structure 180.

The source region 122 may be a region doped with N-type impurities having a high concentration (N+ in FIG. 1). The source region 122 may be positioned at an inner portion of the P-well region 104. For example, an entire interface of the source region 122 may directly contact the P-well region 104.

A doping structure of the drain region 120 and a doping structure of the source region 122 may be different from each other.

In an embodiment, the drain region 120 may not overlap (e.g., in a thickness direction of the substrate 100) a bottom of the gate structure 180. The drain region 120 may be positioned at the substrate 100 outside from the first sidewall of the gate structure 180. The drain region 120 may not be spaced apart from one end (e.g., the first sidewall) of the gate structure 180. Therefore, a horizontal area of the substrate 100 which the high voltage power transistor is formed may be decreased. Since the drain region 120 is disposed adjacent to (e.g., immediately adjacent to) the gate structure 180, currents flowing through a channel of the high voltage power transistor may be increased. Thus, the high voltage power transistor may ha e a high frequency operation characteristic.

In an embodiment, the source region 122 may not overlap the bottom of the gate structure 180. The source region 122 may be positioned at the substrate 100 outside from the second sidewall of the gate structure 180. The source region 122 may not be spaced apart from one end (e.g., the second sidewall) of the gate structure 180.

The gate structure 180 may include a gate insulation layer 143, a first conductive pattern for adjusting a threshold voltage 160, a second conductive pattern for adjusting a threshold voltage 162, and a gate electrode 150*a*. Also, a capping pattern 170 may be further disposed on each of the first conductive pattern for adjusting the threshold voltage 160, the second conductive pattern for adjusting the threshold voltage 162, and the gate electrode 150*a*. In an embodiment, the capping pattern 170 may include silicon nitride.

The gate structure 180 may be disposed on the substrate 100 between the source and drain regions 122 and 120 (e.g., in a direction parallel to an upper surface of the substrate 100). The gate structure 180 may be disposed on (e.g., directly on) the P-well region 104.

An insulating interlayer 130 may be disposed on the substrate 100 adjacent to both sides of the gate structure 180. In an embodiment, the insulating interlayer 130 may include a gate trench, and the gate structure 180 may be disposed in the gate trench.

The gate insulation layer 143 may include a pad oxide layer 140 and a metal oxide layer pattern 142*a* having a high dielectric constant. The pad oxide layer 140 may be disposed on the substrate 100 exposed by a bottom of the gate trench. The metal oxide layer pattern 142*a* may be conformally formed on a sidewall of the gate trench and an upper surface of the pad oxide layer 140.

The pad oxide layer 140 may be disposed between the substrate 100 and the metal oxide layer pattern 142*a* (e.g., in a thickness direction of the substrate 100). In an embodiment, the pad oxide layer 140 may include silicon oxide. The pad oxide layer 140 may be formed by a thermal oxidation process. The metal oxide layer pattern 142*a* may include, e.g., hafnium oxide. However, embodiments of the present disclosure are not necessarily limited thereto.

The first conductive pattern for adjusting the threshold voltage 160 and the second conductive pattern for adjusting the threshold voltage 162 may be disposed on the gate insulation layer 143. In an embodiment, the first conductive pattern for adjusting the threshold voltage 160 and the second conductive pattern for adjusting the threshold voltage 162 may include substantially the same material. In an embodiment, the first conductive pattern for adjusting the threshold voltage 160 and the second conductive pattern for adjusting the threshold voltage 162 may have different thicknesses from each other.

The first conductive pattern for adjusting the threshold voltage 160 may be conformally formed on a first sidewall and a lower surface closer to the drain region 120 in the gate trench (e.g., in an approximate L-shape). The first conductive pattern for adjusting the threshold voltage 160 may have a first thickness t1.

The second conductive pattern for adjusting the threshold voltage 162 may be conformally formed on a second sidewall and a lower surface closer to the source region 122 in the gate trench (e.g., in an approximate L-shape). The second conductive pattern for adjusting the threshold voltage 162 may have a second thickness t2 greater than the first thickness t1. One end of each of the first and second conductive patterns for adjusting the threshold voltage 160 and 162 may directly contact to each other, and the first and second conductive patterns for adjusting the threshold voltage 160 and 162 may be directly connected to each other.

In an embodiment, the first and second conductive patterns for adjusting the threshold voltage 160 and 162 may include, e.g., titanium nitride, titanium, tantalum nitride, or tantalum. However, embodiments of the present disclosure are not necessarily limited thereto.

In an embodiment of the high-voltage power transistor, the first conductive pattern for adjusting the threshold voltage 160 may be controlled to have a first threshold voltage, and the second conductive pattern for adjusting the threshold voltage 162 may be controlled to have a second threshold voltage higher than the first threshold voltage.

In the high-voltage power transistor, a relatively high voltage may be applied to the drain region 120, and a threshold voltage may be low in a region adjacent to the drain region 120. Therefore, in the high-voltage power transistor, currents flowing through a channel may increase. Accordingly, a gain Gm of the high voltage power transistor may be increased, so that a high frequency characteristic may be increased.

The gate electrode 150*a* may be disposed on (e.g., directly on) the first conductive pattern for adjusting the threshold voltage 160 and the second conductive pattern for adjusting the threshold voltage 162. The gate electrode 150*a* may fill the gate trench. The gate electrode may include a metal material. For example, in an embodiment the gate electrode

150*a* may include tungsten. However, embodiments of the present disclosure are not necessarily limited thereto.

As described above, in the high voltage power transistor, the high voltage power transistor may have a characteristic of a high breakdown voltage so that a reliability failure may be decreased. Further, the high voltage power transistor may have an excellent high-frequency characteristic, so that the high voltage power transistor may be used as a power amplifier.

FIGS. 2 to 11 are cross-sectional views illustrating a method of manufacturing the high voltage power transistor shown in FIG. 1.

Figure 2:
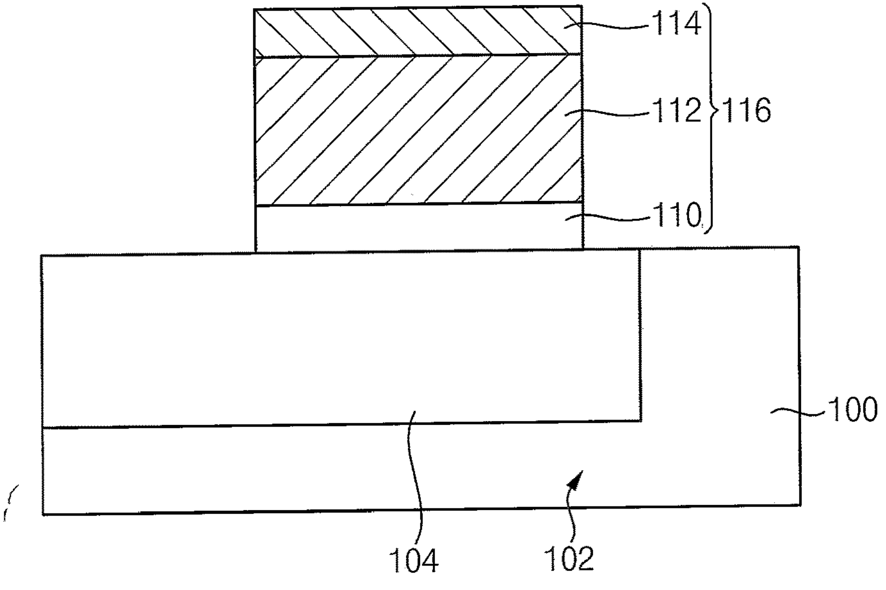

Referring to FIG. 2, an entire surface of a substrate 100 may be lightly doped with P-type impurities to form a P-type sub region 102 doped with P-type impurities having a relatively low concentration in a bulk region of the substrate 100.

An upper portion of the substrate 100 may be lightly doped with P-type impurities to form a P-well region 104 at an upper portion of the substrate 100. The P-well region 104 may be formed in a portion of the substrate on which the high voltage power transistor may be formed. The P-well region 104 may serve as a well region for flowing drift currents in the high voltage power transistor. The P-well region 104 may be positioned under a lower surface of a gate structure and at portions of a source region and a drain region in the high voltage power transistor.

A dummy gate structure 116 may be formed an upper surface of the substrate 100. In an embodiment, the dummy gate structure 116 may have a structure in which a dummy gate insulation layer 110, a polysilicon pattern 112, and a hard mask pattern 114 are stacked (e.g., in a thickness direction of the substrate 100).

Figure 3:
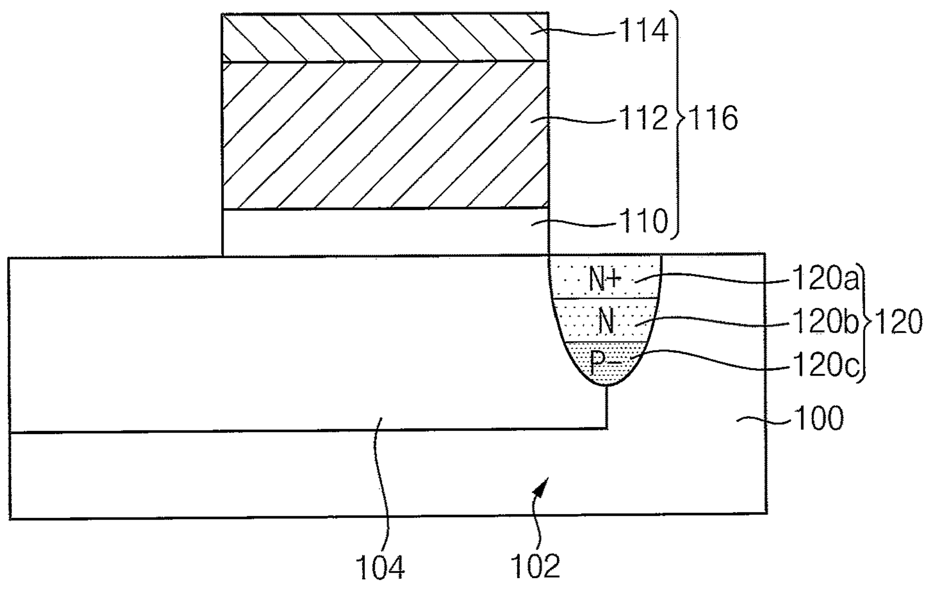

Referring to FIG. 3, a first ion implantation mask exposing the upper portion of the substrate 100 adjacent to a first sidewall of the dummy gate structure 116 may be formed on the substrate 100.

The substrate 100 exposed by the first ion implantation mask may be sequentially doped with impurities having different doping depths to form the drain region 120. The drain region 120 may include a highly doped N-type impurity region 120*a* (N+ in FIG. 3), an N-type impurity region 120*b* (N in FIG. 3), and a lightly doped P-type impurity region 120*c* (P− in FIG. 3) sequentially disposed in a downward direction from the upper surface of the substrate 100 towards a lower surface of the substrate 100.

For example, P-type impurities may be lightly doped in the substrate 100 to form the lightly doped P-type impurity region 120*c* having low concentration of P-type impurities. N-type impurities may be lightly doped in the substrate to form the N-type impurity region 120*b* having low concentration of N-type impurities on the lightly doped P-type impurity region 120*c*. N-type impurities may be further doped at the upper portion of the substrate to form the highly doped N-type impurity region 120*a* having high concentration of N-type impurities.

In the drain region 120, a bottom of the lightly doped P-type impurity region 120*c* may directly contact each of the P-well region 104 and the P-type sub region 102. For example, the bottom of the lightly doped P-type impurity region 120*c* may directly contact a boundary between the P-well region 104 and the P-type sub region 102.

The first ion implantation mask may subsequently be removed.

Figure 4:
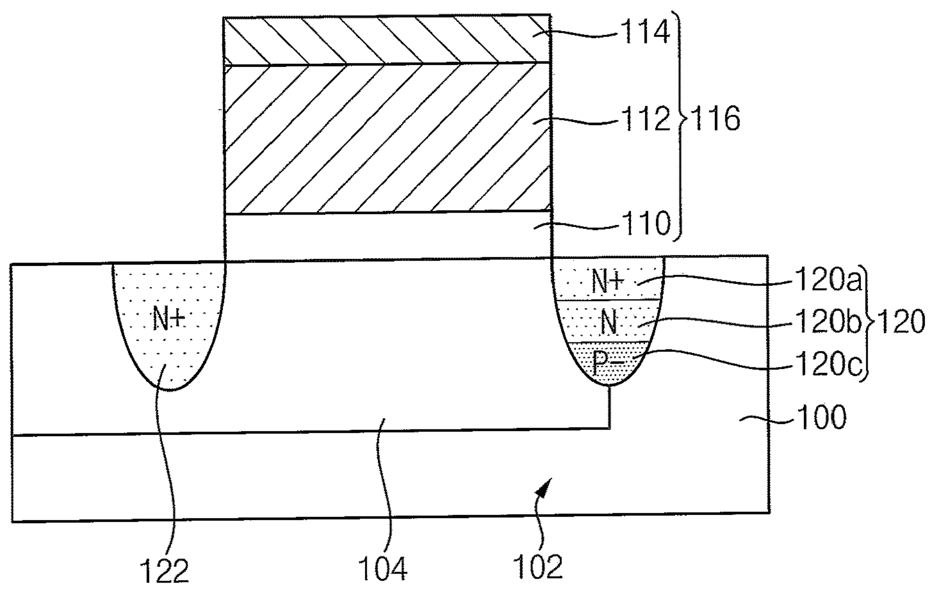

Referring to FIG. 4, a second ion implantation mask exposing the upper portion of the substrate 100 adjacent to a second sidewall of the dummy gate structure 116 may be formed on the substrate 100.

The substrate 100 exposed by the second ion implantation mask may be doped with impurities to form the source region 122. The source region 122 may be a highly doped N-type impurity region (N+ in FIG. 4) having high concentration of N-type impurities. N-type impurities may be highly doped at the upper portion of the substrate to form the source region 122.

Figure 5:
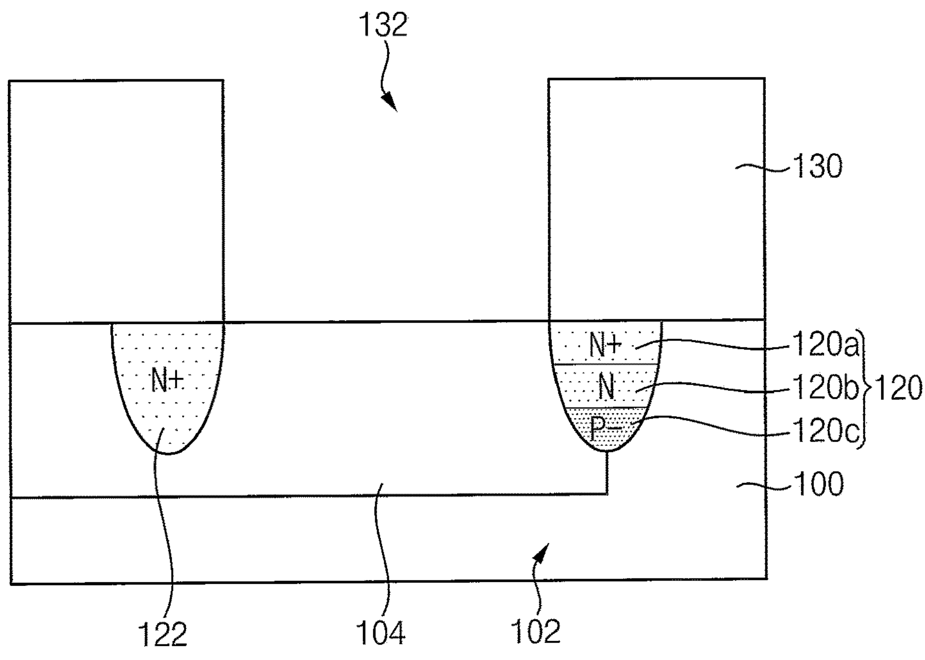

Referring to FIG. 5, an insulating interlayer 130 may be formed on the upper surface of the substrate 100 to cover the dummy gate structure 116. An upper portion of the insulating interlayer 130 may be planarized until an upper surface of the dummy gate structure 116 may be exposed. In an embodiment, the planarization process may include a chemical mechanical polishing (CMP) process.

The dummy gate structure 116 may be subsequently removed to form a gate trench 132 in the insulating interlayer 130.

Figure 6:
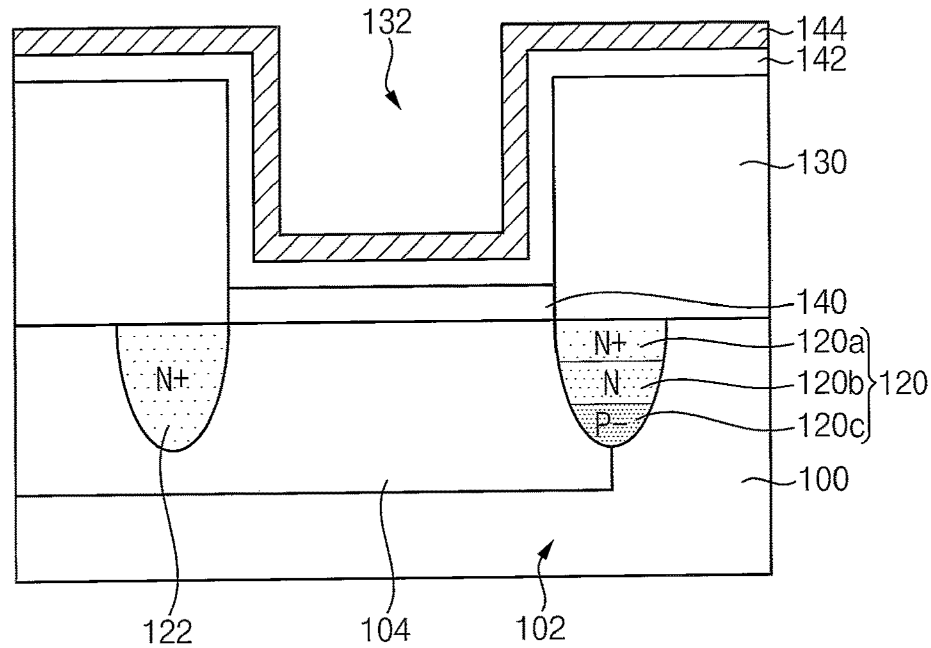

Referring to FIG. 6, a pad oxide layer 140 may be formed on (e.g., directly on) the substrate 100 exposed by a bottom of the gate trench 132. In an embodiment, the pad oxide layer 140 may be formed by thermal oxidation of the substrate 100. However, embodiments of the present disclosure are not necessarily limited thereto.

A metal oxide layer 142 may be conformally formed along a sidewall of the gate trench 132, an upper surface of the pad oxide layer 140 and the upper surface of the insulating interlayer 130.

A first conductive layer for adjusting a threshold voltage 144 may be conformally formed on the metal oxide layer 142.

Figure 7:
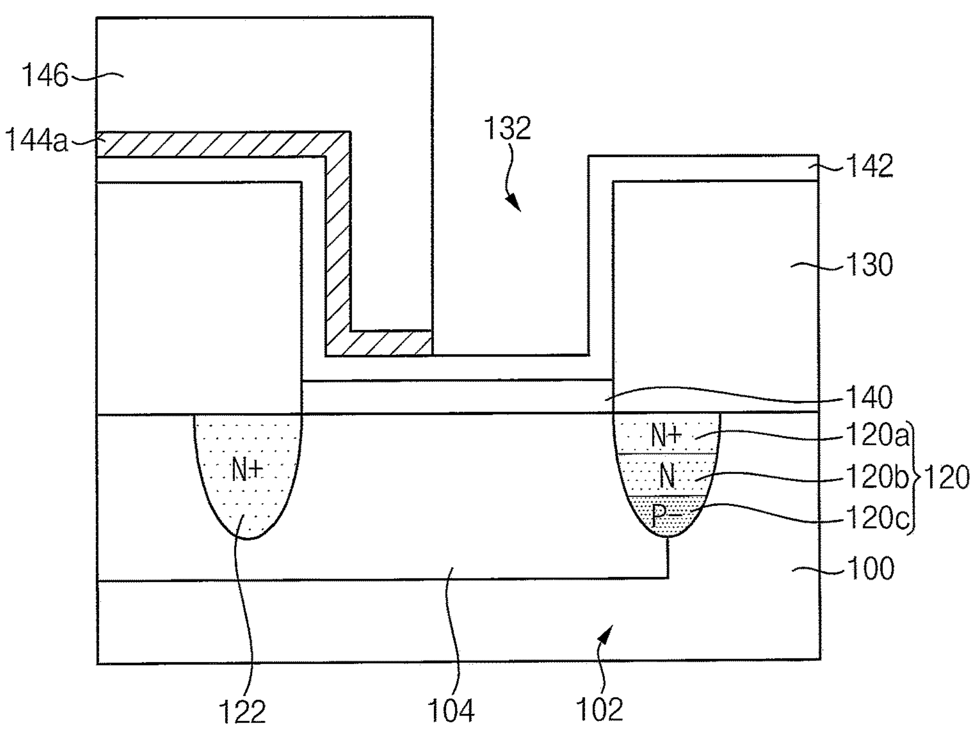

Referring to FIG. 7, an etch mask pattern 146 may be formed on the first conductive layer for adjusting the threshold voltage 144. The etch mask pattern 146 may selectively expose a portion of the first conductive layer for adjusting the threshold voltage 144 that is positioned closer to the drain region 120. An exposed portion of the etch mask pattern 146 may correspond to a portion for forming a first conductive pattern for adjusting a threshold voltage by subsequent processes.

A portion of the first conductive layer for adjusting the threshold voltage 144 may be etched using the etch mask pattern 146 to form a preliminary conductive pattern for adjusting the threshold voltage 144*a*. In an embodiment, the etching process may include an isotropic etching process. The metal oxide layer 142 may be exposed by a portion where the first conductive layer for adjusting the threshold voltage 144 is etched.

As described above, the preliminary conductive pattern for adjusting the threshold voltage 144*a* may be formed on the lower surface and the sidewall closer to the source region 122 in the gate trench 132. In an embodiment, the preliminary conductive pattern for adjusting the threshold voltage 144*a* may not be formed on the lower surface and the sidewall closer to the drain region 120 in the gate trench 132.

The etch mask pattern 146 may be subsequently removed.

Figure 8:
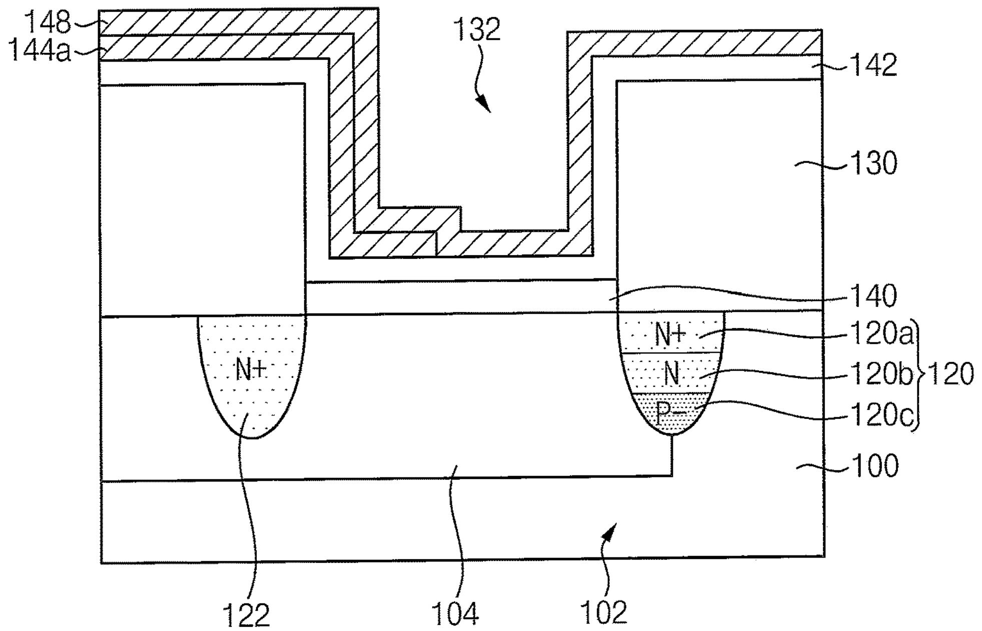

Referring to FIG. 8, a second conductive layer for adjusting the threshold voltage 148 may be conformally formed on the preliminary conductive pattern for adjusting the threshold voltage 144*a* and the exposed portion of the metal oxide layer 142. In an embodiment, the second conductive layer for adjusting the threshold voltage 148 may include a material substantially the same as a material of the preliminary conductive pattern for adjusting the threshold voltage 144*a* Accordingly, the preliminary conductive pattern for adjusting the threshold voltage 144*a* and the second conductive layer for adjusting the threshold voltage 148 may be merged into one conductive layer.

The second conductive layer for adjusting the threshold voltage 148 may have a first thickness. A stack structure including the preliminary conductive pattern for adjusting threshold voltage **144*a* and the second conductive layer for adjusting the threshold voltage 148** may have a second thickness greater than the first thickness.

Figure 9:
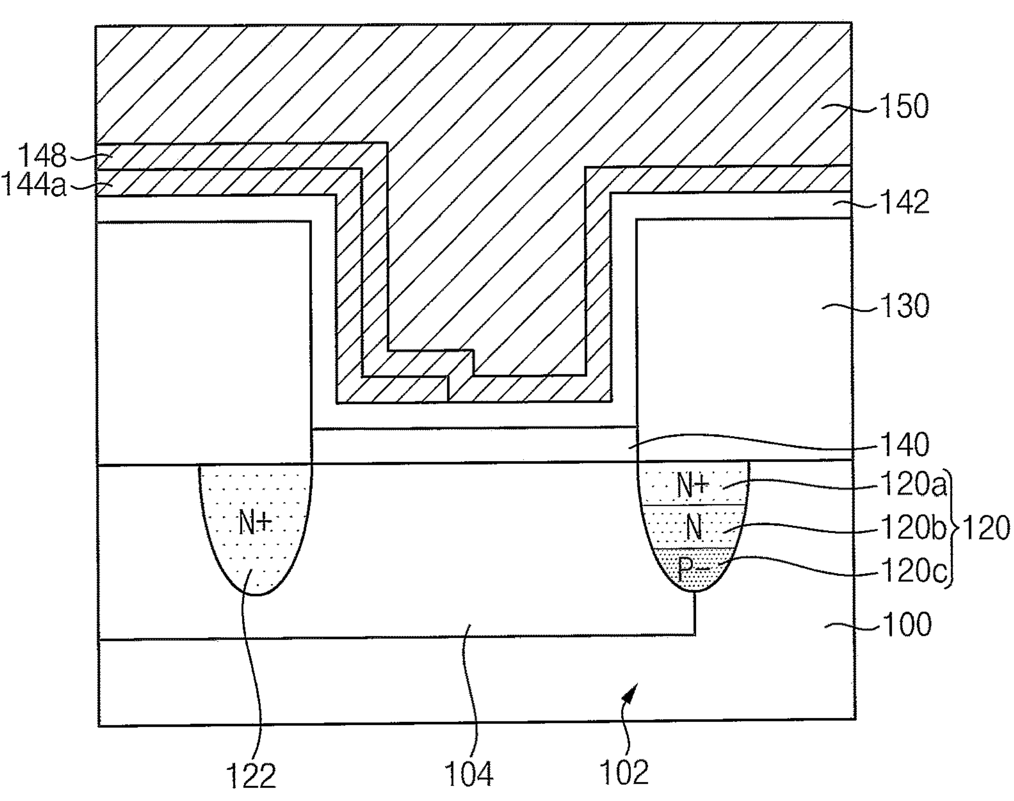

Referring to FIG. 9, a gate electrode layer 150 may be formed on (e.g., directly on) the second conductive layer for adjusting the threshold voltage 148 to fill the gate trench 132.

Figure 10:
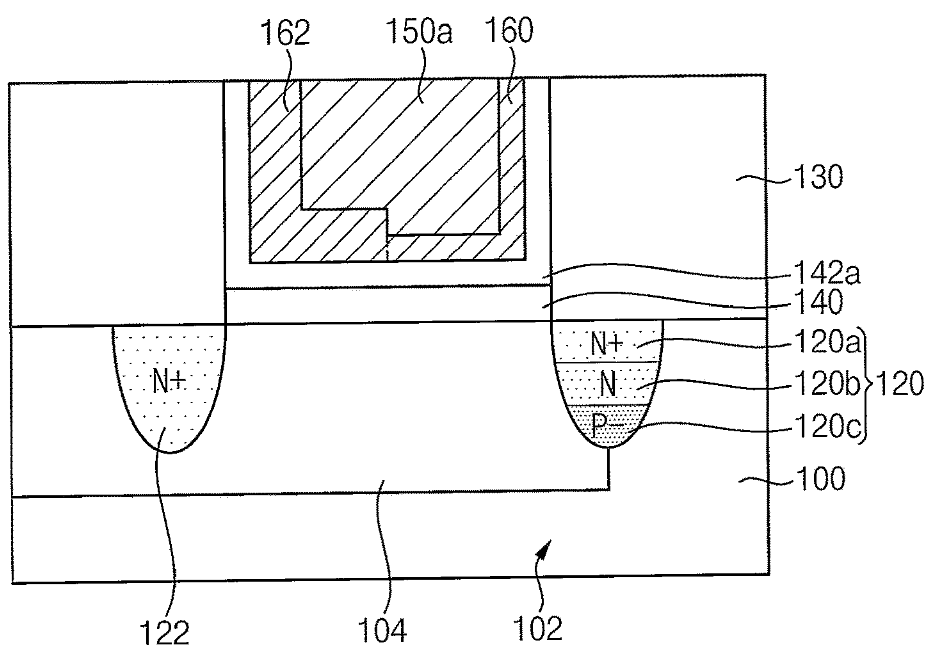

Referring to FIG. 10, upper portions of the gate electrode layer 150, the second conductive layer for adjusting the threshold voltage 148, the preliminary conductive pattern for adjusting the threshold voltage **144*a* and the metal oxide layer 142 may be planarized until an upper surface of the insulating interlayer 130 may be exposed. Thus, a metal oxide layer pattern 142*a*, a first conductive pattern for adjusting the threshold voltage 160, a second conductive pattern for adjusting the threshold voltage 162, and the gate electrode 150*a* may be formed in the gate trench 132**. In an embodiment, the planarization process may include a chemical mechanical polishing process. However, embodiments of the present disclosure are not necessarily limited thereto.

The first conductive pattern for adjusting the threshold voltage 160 may be formed from a remained second conductive layer for adjusting the threshold voltage 148, so that the first conductive pattern for adjusting the threshold voltage 160 may have the first thickness (t1 in FIG. 1). The first conductive pattern for adjusting the threshold voltage 160 may be conformally formed on the lower surface and the sidewall closer to the drain region 120 in the gate trench.

The second conductive pattern for adjusting the threshold voltage 162 may be formed from a remained preliminary conductive pattern for adjusting the threshold voltage **144*a* and the second conductive layer for adjusting the threshold voltage 148, so that the second conductive pattern for adjusting the threshold voltage 162 may have the second thickness (t2 in FIG. 1). The second conductive pattern for adjusting the threshold voltage 162 may be conformally formed on the lower surface and the sidewall closer to the source region 122** in the gate trench.

Figure 11:
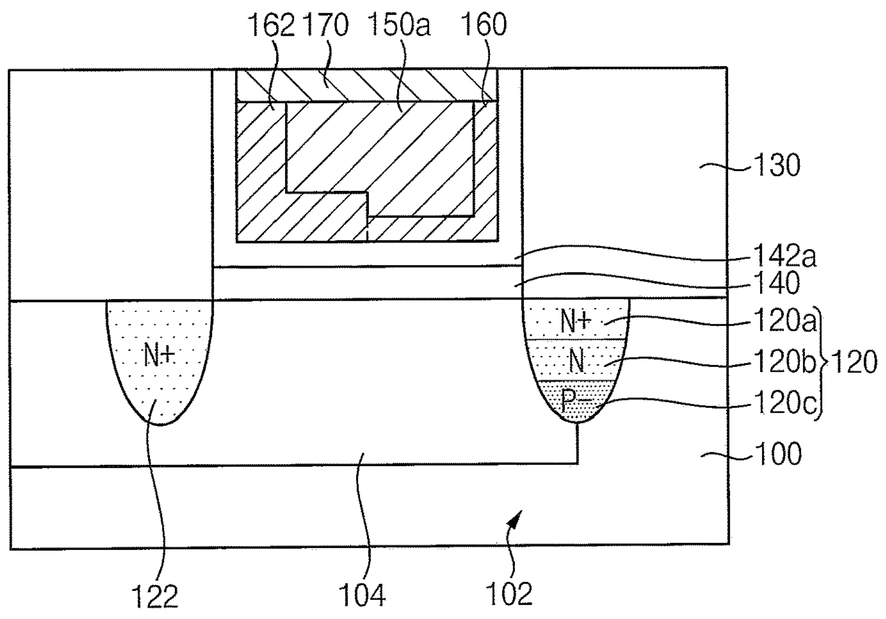

Referring to FIG. 11, upper portions of the gate electrode **150*a*, the first conductive pattern for adjusting the threshold voltage 160, and the second conductive pattern for adjusting the threshold voltage 162 may be partially etched. A capping pattern 170 may be formed on (e.g., directly on) the conductive pattern for adjusting the threshold voltage 160 and the second conductive pattern for adjusting the threshold voltage 162. The capping pattern 170 may be formed in the gate trench. In an embodiment, the capping pattern 170** may include silicon nitride. However, embodiments of the present disclosure are not necessarily limited thereto.

As described above, the high voltage power transistor shown in FIG. 1 may be manufactured.

Figure 12:
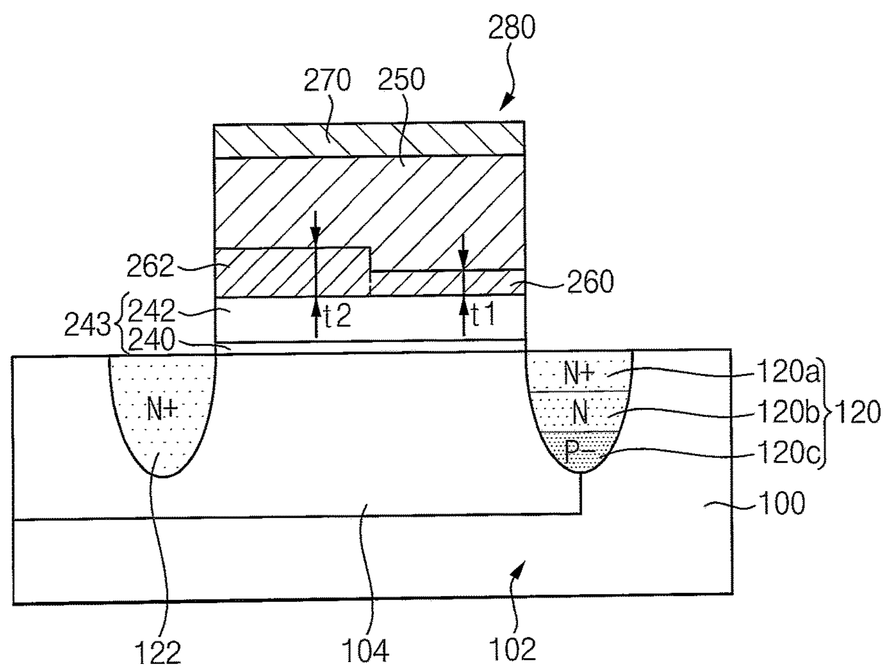

FIG. 12 is a cross-sectional view illustrating a high voltage power transistor in accordance with an embodiment of the present disclosure.

The high voltage power transistor shown in FIG. 12 may be substantially the same as the high voltage power transistor shown in FIG. 1, except for a shape of a gate structure.

Referring to FIG. 12, a gate structure 280 may include a gate insulation layer 243, a first conductive pattern for adjusting a threshold voltage 260, a second conductive pattern for adjusting a threshold voltage 262, and a gate electrode 250. A capping pattern 270 may be formed on the gate electrode 250.

The gate structure 280 may be formed on the substrate 100 between the source region 122 and the drain region 120 (e.g., in a direction parallel to an upper surface of the substrate 100). The gate structure 280 may be formed on the P-well region 104.

The gate insulation layer 243 may be formed on the substrate 100 (e.g., formed directly thereon). The gate insulation layer 243 may include a pad oxide layer 240 and a metal oxide layer 242 having a high dielectric constant. The pad oxide layer 240 may be formed between the substrate 100 and the metal oxide layer 242 (e.g., in a thickness direction of the substrate 100).

The first conductive pattern for adjusting the threshold voltage 260 and the second conductive pattern for adjusting the threshold voltage 262 may be formed on the gate insulation layer 243 (e.g., formed directly thereon). In an embodiment, the first conductive pattern for adjusting the threshold voltage 260 may include a material substantially the same as a material of the second conductive pattern for adjusting the threshold voltage 262. The first conductive pattern for adjusting the threshold voltage 260 and the second conductive pattern for adjusting the threshold voltage 262 may have different thicknesses from each other.

The first conductive pattern for adjusting the threshold voltage 260 may be positioned on the gate insulation layer 243 closer to the drain region 120, and the first conductive pattern for adjusting the threshold voltage 260 may have a first thickness t1. The second conductive pattern for adjusting the threshold voltage 262 may be positioned on the gate insulation layer 243 closer to the source region 122, and the second conductive pattern for adjusting the threshold voltage 262 may have a second thickness t2 greater than the first thickness t1. One end of each of the first and second conductive patterns for adjusting the threshold voltage 260 and 262 may directly contact to each other. The first and second conductive patterns for adjusting the threshold voltage 260 and 262 may be directly connected to each other. A cross-section of a contact portion of the first and second conductive patterns for adjusting threshold voltage 260 and 262 may have a stepped shape.

In an embodiment, the first and second conductive patterns for adjusting the threshold voltage 260 and 262 may include e.g., titanium nitride, titanium, tantalum nitride, or tantalum. However, embodiments of the present disclosure are not necessarily limited thereto.

The gate electrode 250 may be formed on (e.g., formed directly thereon) the first conductive pattern for adjusting the threshold voltage 260 and the second conductive pattern for adjusting the threshold voltage 262. In an embodiment, the gate electrode 250 may include a metal material. For example, the gate electrode 250 may include tungsten.

As shown in FIG. 12, the high voltage power transistor may be a planar transistor. For example, in contrast to an embodiment shown in FIG. 1, an embodiment of the high voltage power transistor shown in FIG. 12 does not include the first conductive pattern for adjusting the threshold voltage 260 conformally formed on a first sidewall of the gate structure 280 or the second conductive pattern for adjusting the threshold voltage 262 conformally formed on a second sidewall of the gate structure 280.

Figure 13:
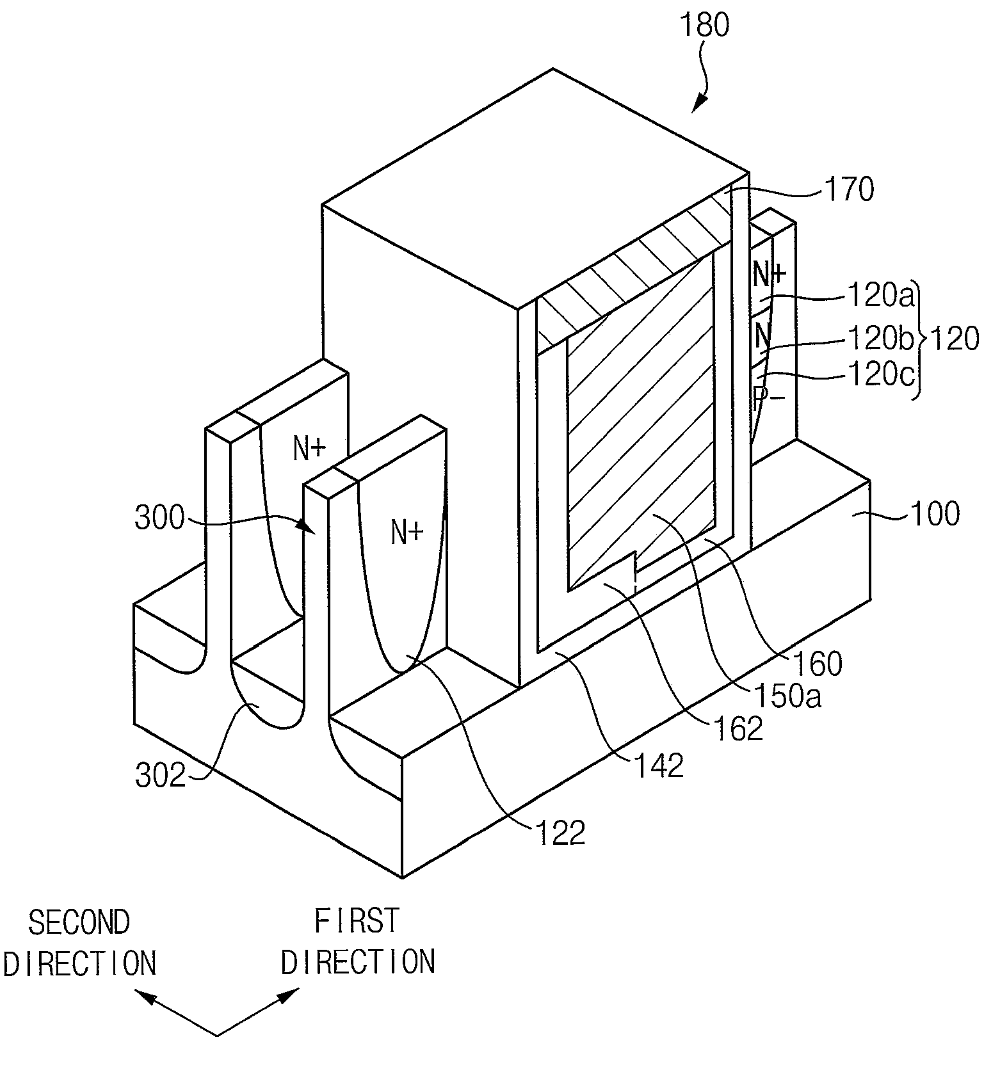
Figure 14:
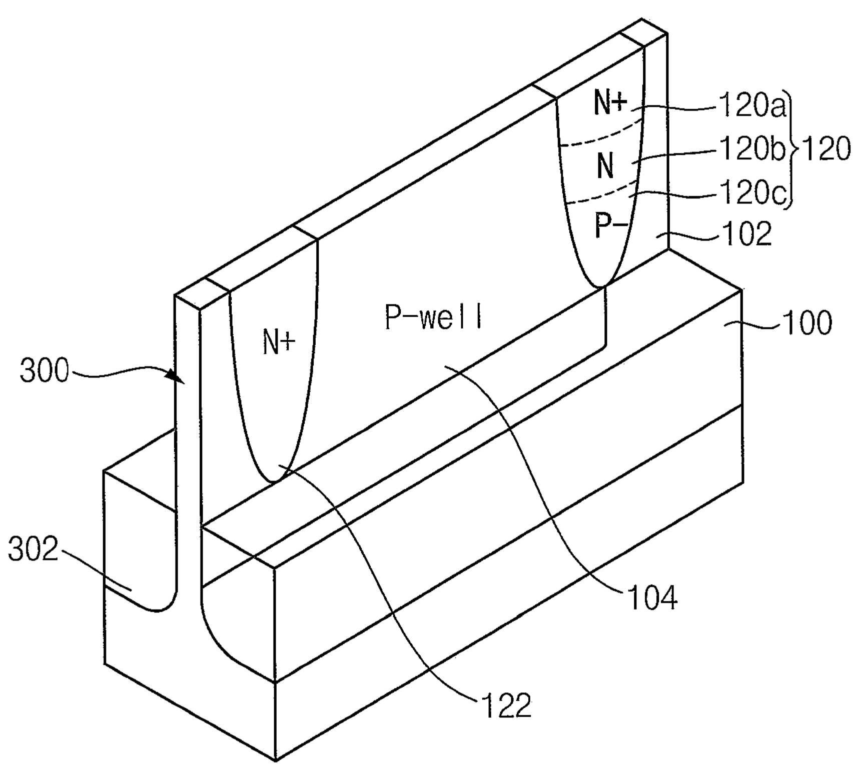

FIG. 13 is a perspective view illustrating a high voltage power transistor in accordance with an embodiment of the present disclosure. FIG. 14 is a perspective view illustrating an active fin in the high voltage power transistor shown in FIG. 13.

The high voltage power transistor shown in FIG. 13 may be substantially the same as the high voltage power transistor shown in FIG. 1, except that the high voltage power transistor has a fin FET structure.

Referring to FIGS. 13 and 14, an active fin 300 may protrude from a surface of a substrate 100. The active fin 300 may extend longitudinally in the first direction. A plurality of active fins 300 may be repeatedly disposed to be spaced apart from each other in the second direction. In an embodiment, the active fin 300 may be formed by partially etching an upper portion of a bare substrate. However, embodiments of the present disclosure are not necessarily limited thereto.

An isolation pattern 302 may be disposed on the substrate 100 at a lower portion between the active fins 300 in the second direction. In an embodiment, the isolation pattern 302 may include an insulation material, such as silicon oxide, etc. The active fin 300 protruding from the isolation pattern 302 may serve as an active region in the high voltage power transistor.

The gate structure 180 may be disposed on (e.g., directly on) the isolation pattern 302 and the active fins 300. The gate structure 180 may surround surfaces of the active fins 300. The gate structure 180 may extend longitudinally in the second direction. The source region 122 and the drain region 120 may be disposed in the active fin 300 adjacent to both sides of the gate structure 180 (e.g., in the first direction).

A portion of the active fin 300 and a bulk region of the substrate 100 positioned under the active fin 300 may be the P-type sub region 102 lightly doped with P-type impurities. A portion of the active fin 300 may be the P-well region 104. The P-well region 104 may overlap at least a lower surface of the gate structure 180.

The drain region 120 may be positioned at a portion of the active fin 300 adjacent to the first sidewall of the gate structure 180. In the drain region 120, doping concentration of the impurities may gradually decrease in a downward direction from an upper surface of the active fin 300 towards a lower surface of the active fin 300. The drain region 120 may include portions having different conductivity type. In the drain region 120, a conductivity type of impurities in a lowermost portion may be different from a conductivity type of impurities in an upper portion on the lowermost portion.

The drain region 120 may include the highly doped N-type impurity region 120*a* (N+ in FIGS. 13 and 14), the N-type impurity region 120*b* (N in FIGS. 13 and 14), and the lightly doped P-type impurity region 120*c* (P− in FIGS. 13 and 14). The highly doped N-type impurity region 120*a*, the N-type impurity region 120*b*, and the lightly doped P-type impurity region 120*c* may be sequentially disposed from a top of the active fin 300 to a bottom of the active fin 300.

In an embodiment, a bottom of the drain region 120 may be adjacent to the upper surface of the isolation pattern 302. For example, the bottom of the drain region 120 and the upper surface of the isolation pattern 302 may be coplanar with each other.

At least a portion of the lower interface of the drain region 120 may directly contact the P-well region 104, and a remaining portion of the lower interface of the drain region 120 may directly contact the P-type sub region 102. The boundary between the P-well region 104 and the P-type sub region 102 may be positioned under the bottom of the drain region 120.

In an embodiment, an insulating interlayer may be disposed on the active fin 300 and the isolation pattern 302 adjacent both sides of the gate structure 180. A gate trench may be formed in the insulating interlayer, and the gate structure 180 may be disposed in the gate trench.

In an embodiment, the gate structure 180 may include the gate insulation layer, the first conductive pattern for adjusting a threshold voltage 160, the second conductive pattern for adjusting a threshold voltage 162, the gate electrode 150*a*, and the capping pattern 170.

In an embodiment, the gate insulation layer may include a pad insulation layer disposed on the surface of the active fin 300 and a metal oxide layer 142 disposed on the pad insulation layer along a sidewall and a bottom of the gate trench.

The first conductive pattern for adjusting the threshold voltage 160 may be disposed on the first sidewall and the lower surface closer to the drain region 120 in the gate trench (e.g., in an approximate L-shape). The first conductive pattern for adjusting the threshold voltage 160 may have the first thickness.

The second conductive pattern for adjusting the threshold voltage 162 may be formed on the second sidewall and the lower surface closer to the source region 122 in the gate trench (e.g., in an approximate L-shape). The second conductive pattern for adjusting the threshold voltage 162 may have the second thickness greater than the first thickness. One end of each of the first and second conductive patterns for adjusting the threshold voltage 160 and 162 may directly contact to each other. The first and second conductive patterns for adjusting the threshold voltage 160 and 162 may be directly connected to each other.

Figure 15:
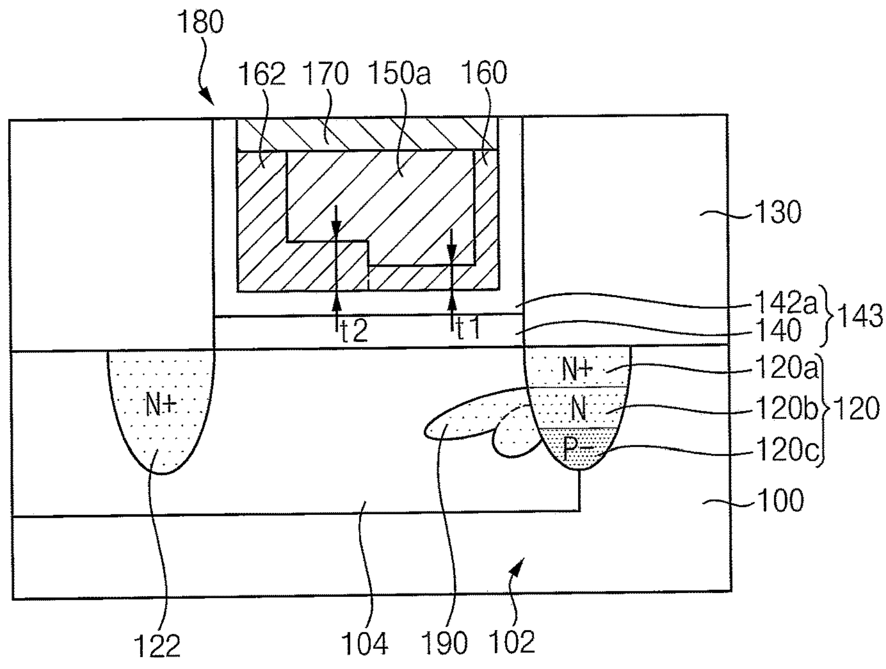

FIG. 15 is a cross-sectional view illustrating a high voltage power transistor in accordance with an embodiment of the present disclosure.

The high voltage power transistor shown in FIG. 15 may be substantially the same as the high voltage power transistor shown in FIG. 1, except for an additional impurity region.

Referring to FIG. 15, the drain region 120 may include the highly doped N-type impurity region 120*a* (N+ in FIG. 15), the N-type impurity region 120*b* (N in FIG. 15), and the lightly doped P-type impurity region 120*c* (P− in FIG. 15). The highly doped N-type impurity region 120*a*, the N-type impurity region 120*b*, and the lightly doped P-type impurity region 120*c* may be sequentially disposed in a downward direction from the upper surface of the substrate 100 towards the lower surface of the substrate 100. A doping concentration of the drain region 120 may gradually decrease downwardly from a top of the substrate 100.

The additional impurity region 190 may directly contact one sidewall of the drain region 120 that faces the source region 122, and may protrude from the sidewall of the drain region 120 towards the source region 122. In an embodiment, the additional impurity region 190 may be doped with N-type impurities.

In an embodiment, the additional impurity region 190 may be formed by additionally doping impurities into the P-well region 104, before forming the dummy gate electrode structure.

An upper portion of the additional impurity region 190 may be positioned lower than the upper surface of the substrate 100. For example, the additional impurity region 190 may be spaced apart from the upper surface of the substrate 100 (e.g., in a thickness direction of the substrate 100). In an embodiment, the additional impurity region 190 may protrude from the sidewall of the N-type impurity region 120*b* in the drain region 120 towards the source region 122.

Based on the presence of the additional impurity region 190, drift currents may flow through the drain region 120 and the additional impurity region 190. Therefore, the drift currents flowing along the upper surface of the substrate may be decreased. When the high voltage power transistor is operated, a reliability failure due to hot carrier injection may be decreased.

Figure 16:
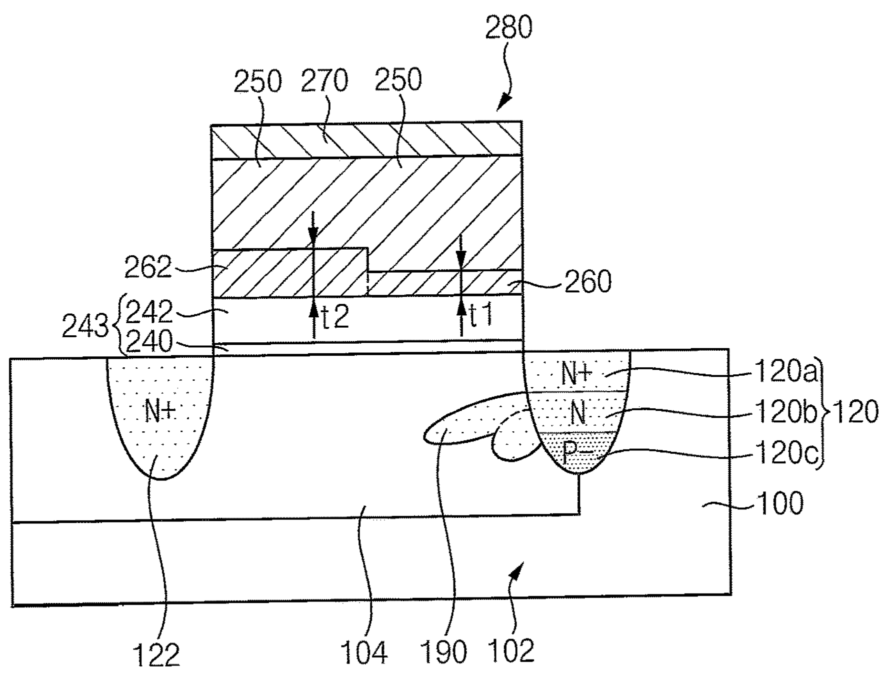

FIG. 16 is a cross-sectional view illustrating a high voltage power transistor in accordance with an embodiment of the present disclosure.

The high voltage power transistor shown in FIG. 16 may be substantially the same as the high voltage power transistor shown in FIG. 12, except for the additional impurity region 190. The additional impurity region 190 in an embodiment of FIG. 16 is substantially the same as the additional impurity region 190 in an embodiment of FIG. 15 and a repeated description of similar or identical elements is omitted for convenience of explanation.

Figure 17:
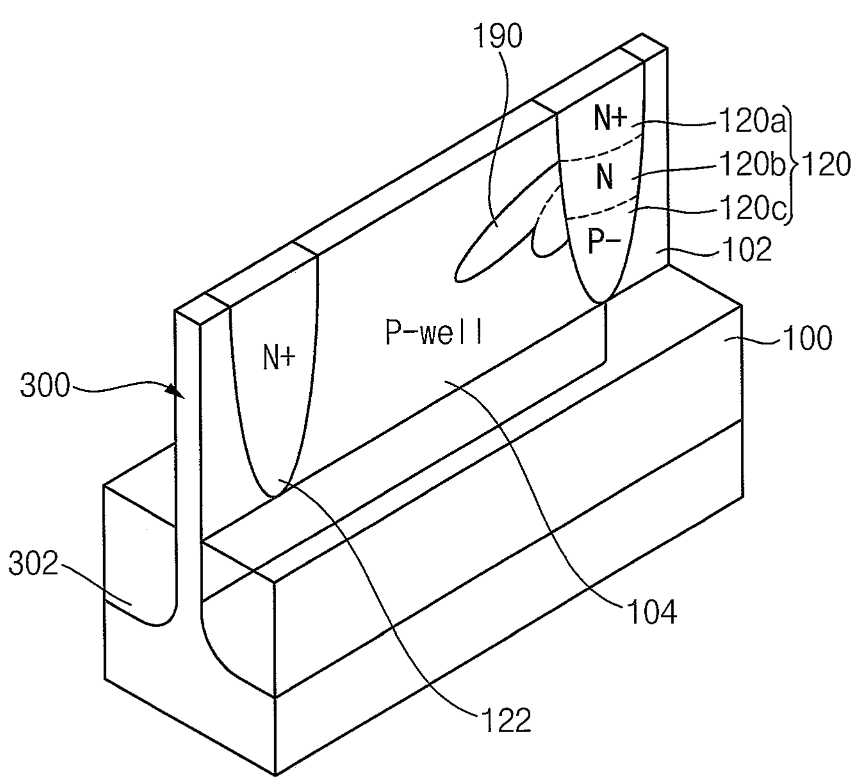

FIG. 17 is a perspective view illustrating a high voltage power transistor in accordance with an embodiment of the present disclosure.

The high voltage power transistor shown in FIG. 17 may be substantially the same as the high voltage power transistor shown in FIG. 13, except for the additional impurity region 190.

Referring to FIG. 17, the drain region 120 may be positioned at a portion of the active fin 300 adjacent to the first sidewall of the gate structure. The drain region 120 may include the highly doped N-type impurity region **120*a* (N+ in FIG. 17), the N-type impurity region 120*b* (N in FIG. 17), and the lightly doped P-type impurity region 120*c* (P− in FIG. 17). The highly doped N-type impurity region 120*a*, the N-type impurity region 120*b*, and the lightly doped P-type impurity region 120*c* may be sequentially disposed from an upper portion to a lower portion of the active fin 300**.

In an embodiment, a bottom of the drain region 120 and an upper surface of the isolation pattern 302 may be coplanar with each other.

The additional impurity region 190 may directly contact one sidewall of the drain region 120, and may protrude from the sidewall of the drain region 120 towards the source region 122. In an embodiment, the additional impurity region 190 may be doped with N-type impurities.

In an embodiment, the additional impurity region 190 may be formed by additionally doping impurities into the P-well region 104, before forming the dummy gate electrode structure.

An upper portion of the additional impurity region 190 may be positioned lower than an upper surface of the active fin 300. For example, the additional impurity region 190 may be spaced apart from the upper surface of the active fin 300. In an embodiment, the additional impurity region 190 may protrude from a sidewall of the N-type impurity region **120*b* in the drain region 120 toward the source region 122**. However, embodiments of the present disclosure are not necessarily limited thereto.

Based on the presence of the additional impurity region 190, drift currents may flow through the drain region 120 and the additional impurity region 190. Therefore, the drift currents flowing along the upper surface of the active fin 300 may be decreased. When the high voltage power transistor is operated, a reliability failure due to hot carrier injection may be decreased.

Figure 18:
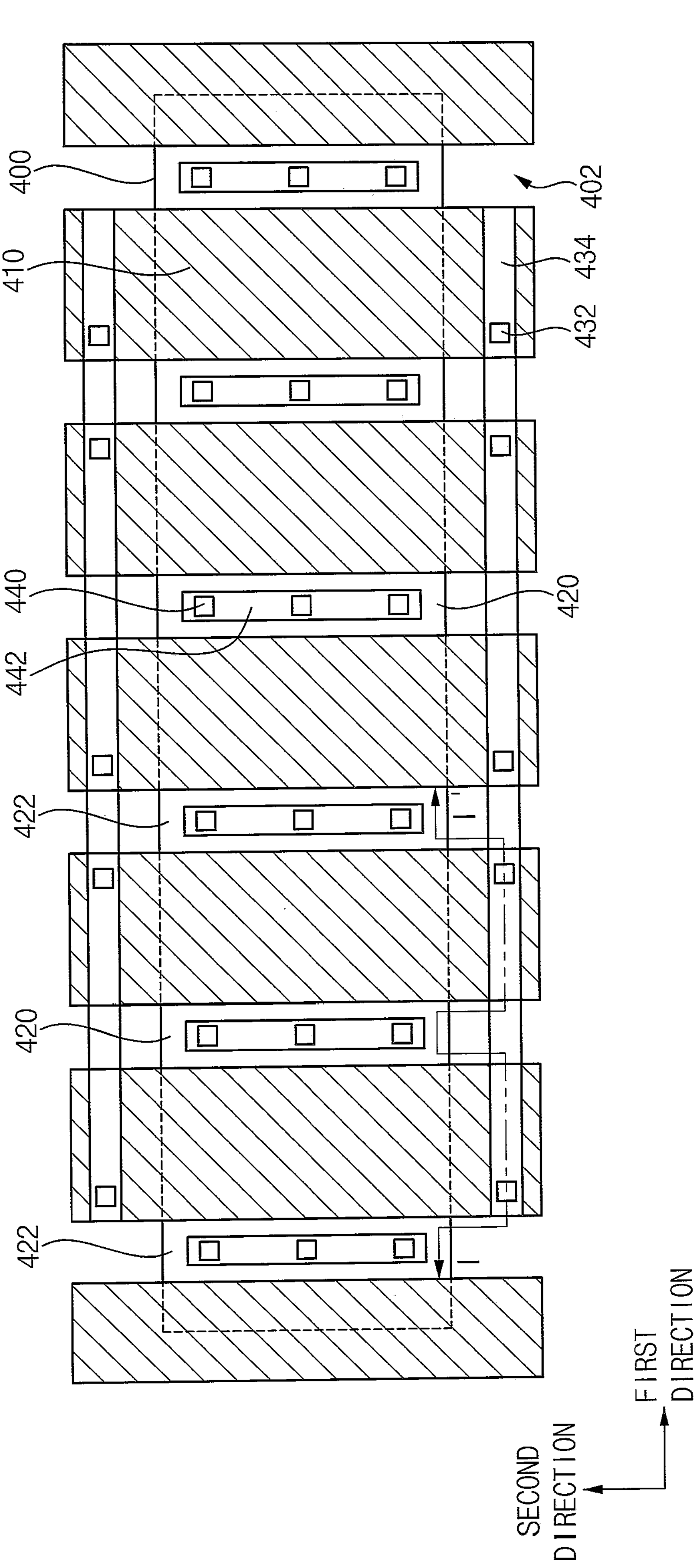
Figure 19:
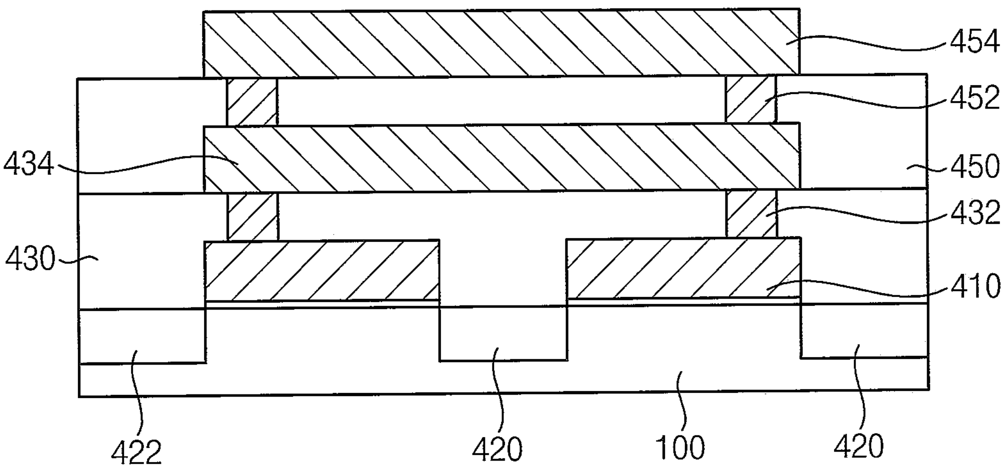

FIGS. 18 and 19 are a plan view and a cross-sectional view illustrating a high voltage power transistor in accordance with example embodiments.

FIG. 18 illustrates only a layout from a substrate to first and second metal wirings. FIG. 19 is a cross-sectional view taken along a line I-I' of FIG. 18.

As shown in embodiments of FIGS. 18 and 19, a substrate 100 may include an active region 400 and an isolation region 402. In an embodiment, the isolation region 402 may be a region in which an isolation pattern is filled in a trench of the substrate. The active region 400 may have a line shape extending in the first direction. However, embodiments of the present disclosure are not necessarily limited thereto.

A plurality of gate structures 410 may be disposed to cross the active region 400 on the substrate. In an embodiment the gate structures 410 may extend longitudinally in the second direction perpendicular to the first direction. The gate structures 410 may be spaced apart from each other in the first direction. Both ends of each gate structure 410 in the second direction may extend outside the active region 400 and may be positioned on the isolation region 402.

The gate structure 410 may include a gate insulation layer, a gate electrode, and a capping layer pattern that are stacked (e.g., in a thickness direction of the substrate 100).

In an embodiment, the gate structure 410 may have the same structure as the gate structure shown in FIG. 1 or FIG. 11 and a repeated description of similar or identical elements may be omitted for convenience of explanation.

In an embodiment, a spacer may be further disposed on a sidewall of the gate structure 410.

A source region 422 and a drain region 420 may be disposed in the active region adjacent to both sides of the gate structures 410, respectively (e.g., in the second direction). The source region 422 and the drain region 420 may be alternately disposed in active region adjacent to the both sides of the gate structures 410. For example, in an embodiment the source region 422 and the drain region 420 may be alternately arranged in the first direction.

In an embodiment, the drain region 420 may have the same structure as the drain region shown in FIG. 1, and the source region 422 may have the same structure as the source region shown in FIG. 1 and repeated descriptions of similar or identical elements may be omitted for convenience of explanation.

In an embodiment, as shown in FIG. 15, the additional impurity region may be further disposed at one side of the drain region 420.

A first insulating interlayer 430 may be disposed on the substrate 100 to cover the gate structures 410.

A first contact plug 432 may extend through the first insulating interlayer 430. A plurality of the first contact plugs 432 may directly contact the gate electrodes of the gate structures 410, respectively.

In an embodiment, the first contact plugs 432 may be disposed on (e.g., directly on) upper surfaces of both ends of the gate structures 410 in the second direction, respectively.

In an embodiment one or a plurality of the first contact plugs 432 may be disposed on the upper surfaces of both ends of each of the gate structures 410 in the second direction.

In an embodiment, when one first contact plug is disposed on an upper surface of each of both ends of the gate structure 410 in the second direction, the first contact plug 432 may be disposed closer to the source region 422 rather than the drain region 420. For example, a distance between the first contact plug 432 and the source region 422 may be less than the distance between the first contact plug 432 and the drain region 420.

In an embodiment the first contact plug 432 may be asymmetrically disposed with respect to a center of the gate structure 410 in the first direction.

A first wiring line 434 connecting (e.g., directly connecting) the first contact plugs 432 to each other may be disposed on the first contact plugs 432 and the first insulating interlayer 430. For example, in an embodiment, the first wiring line 434 may be disposed directly on upper surfaces of the first contact plugs 432 and the first insulating interlayer 430. The first wiring line 434 may extend in the first direction.

In an embodiment, the first contact plug 432 may be disposed to closer the source region 422, so that a parasitic capacitance between the gate electrode and the drain region 420 may be decreased. Therefore, a high-frequency characteristic in the high-voltage power transistor may be increased.

A second contact plug 440 may extend through the first insulating interlayer 430. A plurality of second contact plugs 440 may directly contact the source region 422 and the drain region 420, respectively. The plurality of second contact plugs 440 may be disposed on the source region 422 in parallel in the second direction, and the plurality of second contact plugs 440 may be disposed on the drain region 420 in parallel in the second direction.

A second wiring line 442 connecting the second contact plugs 440 to each other may be disposed on (e.g., directly on) the second contact plugs 440 and the first insulating interlayer 430. The second wiring line 442 may connect (e.g., directly connect) the second contact plugs 440 on the same source region 422 to each other. Also, the second wiring line 442 may connect (e.g., directly connect) the second contact plugs 440 on the same drain region 420 to each other. The second wiring line 442 may extend in the second direction.

A second insulating interlayer 450 may be disposed on (e.g., directly on) the first insulating interlayer 430 and the first and second wiring lines 434 and 442 to cover the first insulating interlayer 430 and the first and second wiring lines 434 and 442.

A third contact plug 452 may extend through the second insulating interlayer 450. The third contact plug 452 may directly contact an upper surface of the first wiring line 434. The third contact plug 452 may be disposed on the first wiring line 434 in a position closer to the source region 422. In an embodiment, the third contact plug 452 and the first contact plug 432 may be aligned in a vertical direction. Therefore, a parasitic capacitance between the gate electrode and the drain region 420 may be decreased, and high frequency characteristics in the high voltage power transistor may be increased.

A third wiring line 454 connecting the third contact plugs 452 to each other may be disposed on (e.g., directly on) the third contact plugs 452 and the second insulating interlayer 450. The third wiring line 454 may extend in the first direction. In an embodiment, the third wiring line 454 may be disposed over the first wiring line 434, and the third wiring line 454 and may overlap the first wiring line 434 (e.g., in the vertical direction).

In an embodiment, a fourth contact plug may be disposed to extend through the second insulating interlayer 450. The fourth contact plug may directly contact a surface of the second wiring line 442, such as an upper surface of the second wiring line 442. In an embodiment, the fourth contact plug and the second contact plug 440 may be aligned in the vertical direction.

In an embodiment, a fourth wiring line connecting the fourth contact plugs to each other may be disposed on (e.g., directly on) the fourth contact plugs and the second insulating interlayer 450. The fourth wiring line may extend in the second direction. In an embodiment, the fourth wiring line may be disposed over the second wiring line 442, and the fourth wiring line may overlap the second wiring line 442 (in the vertical direction).

Figure 20:
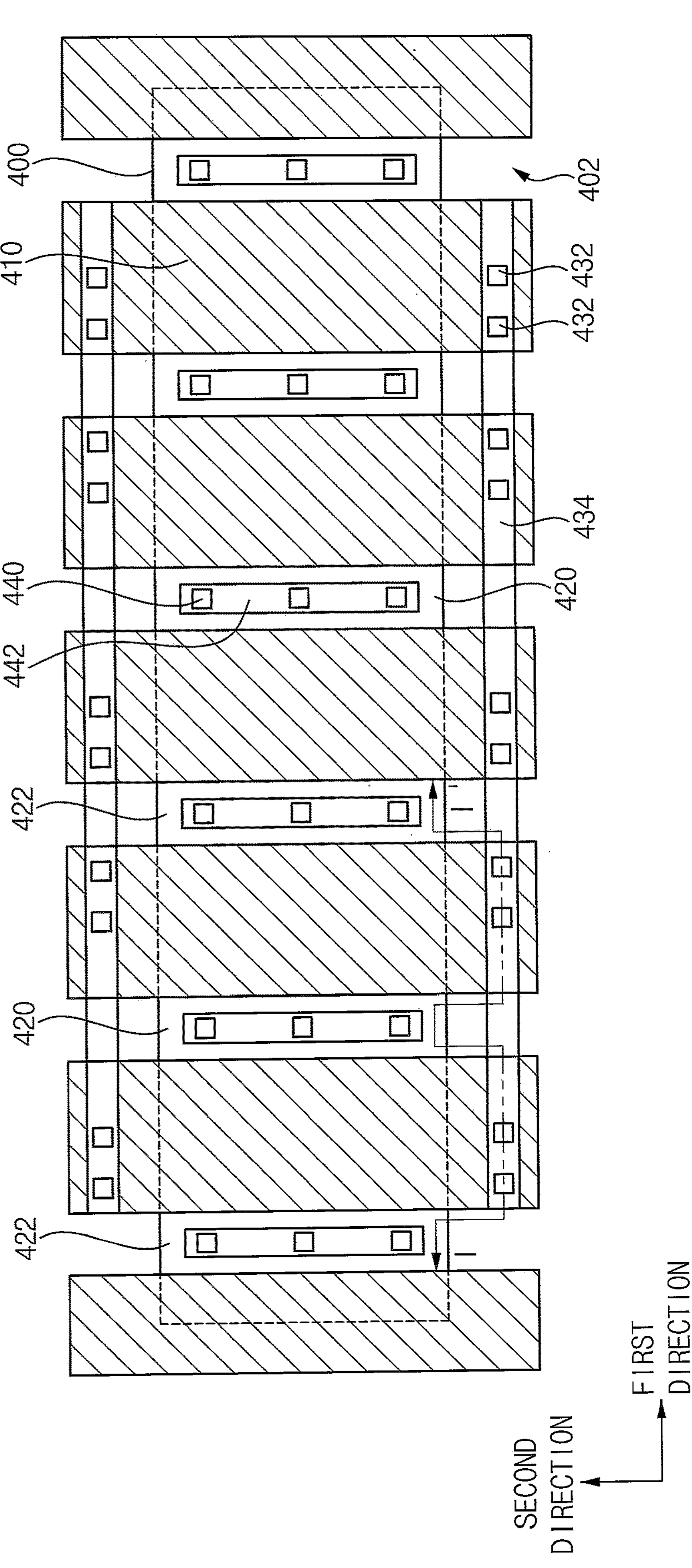
Figure 21:
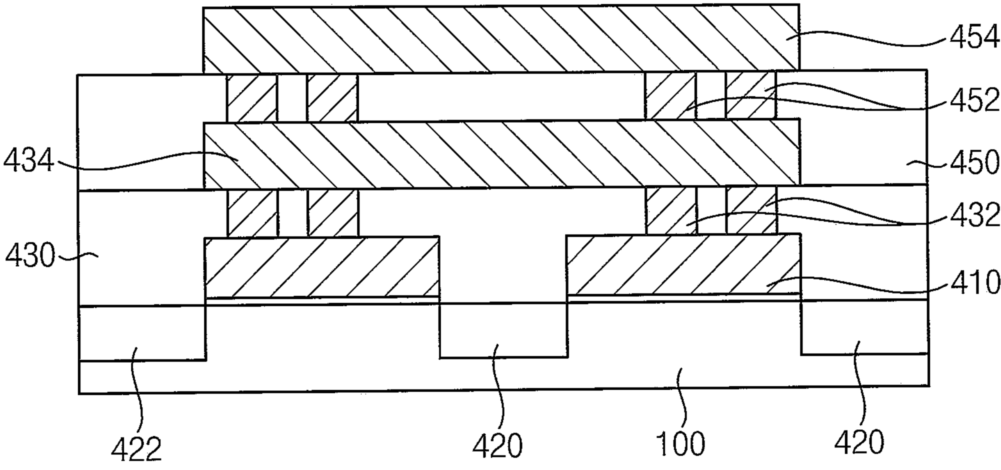

FIGS. 20 and 21 are a plan view and a cross-sectional view illustrating a high voltage power transistor in accordance with example embodiments.

FIG. 20 illustrates only a layout from a substrate to first and second metal wirings.

The high voltage power transistor shown in FIGS. 20 and 21 may be substantially the same as the high voltage power transistor shown in FIGS. 18 and 19, except for an arrangement of the first contact plugs and the third contact plugs.

In embodiments shown in FIGS. 20 and 21, a plurality of first contact plugs 432 may be disposed on an upper surface of both ends of the gate structure 410 in the second direction. In this embodiment, the plurality of first contact plugs 432 may be disposed on the gate structure 410 in a position closer to the source region 422.

Also, a plurality of third contact plugs 452 may extend through the second insulating interlayer 450. The plurality of third contact plugs 452 may directly contact an upper surface of the first wiring line 434.

The third contact plugs 452 may be disposed on (e.g., directly on) the first wiring line 434 in a position closer to the source region 422. In an embodiment, the third contact plugs 452 and the first contact plug 432 may be aligned in the vertical direction. Therefore, a parasitic capacitance between the gate electrode and the drain region 420 may be decreased, and high frequency characteristics in the high voltage power transistor may be increased.

Figure 22:
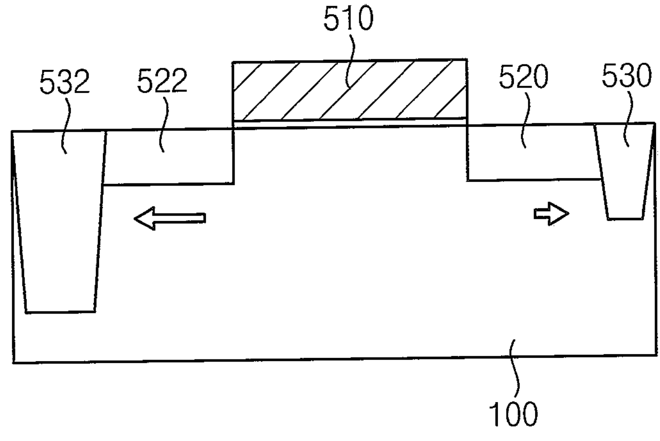

FIG. 22 is a cross-sectional view illustrating a high voltage power transistor in accordance with an embodiment of the present disclosure.

Referring to FIG. 22, a substrate 100 may include an active region and an isolation region. The isolation region may be a region in which an isolation pattern 530 and 532 is filled in each of trenches of the substrate. The active region may be surrounded by the isolation region.

A gate structure 510 may be disposed to cross the active region on the substrate 100. In an embodiment, the gate structure 510 may include a gate insulation layer, a gate electrode, and a capping layer pattern stacked (e.g., in the vertical direction).

In an embodiment, the gate structure 510 may have the same structure as the gate structure shown in FIG. 1 or FIG. 11 and a repeated description of similar or identical elements may be omitted for convenience of description. In an embodiment, a spacer may be further disposed on a sidewall of the gate structure.

A source region 522 and a drain region 520 may be disposed in the active regions adjacent to both sides of the gate structure 510, respectively. In an embodiment, the drain region 520 may be disposed in the active region adjacent to the first sidewall of the gate structure 510, and the source region 522 may be disposed in the active region adjacent to the second sidewall facing the first sidewall of the gate structure 510.

In an embodiment, the drain region 520 may have the same structure as the drain region shown in FIG. 1, and the source region 522 may have the same structure as the source region shown in FIG. 1 and a repeated description of similar or identical elements may be omitted for convenience of description.

In some embodiments, as shown in FIG. 15, an additional impurity region may be further disposed at one side of the drain region 520.

Outer walls of edges of the source region 522 and the drain region 520 may directly contact the isolation patterns 530 and 532, respectively. A first isolation pattern 530 may directly contact the drain region 520, and a second isolation pattern 532 may directly contact the source region 522.

In an embodiment, the first and second isolation patterns 530 and 532 may include an insulation material that applies tensile stress to the substrate 100 adjacent thereto. For example, in an embodiment the first and second isolation patterns 530 and 532 may include silicon oxide. The tensile stress applied to the substrate 100 may be controlled by the first and second isolation patterns 530 and 532.

The first isolation pattern 530 and the second isolation pattern 532 may have different shapes from each other. For example, the first isolation pattern 530 and the second isolation pattern 532 may have different volumes from each other. The first isolation pattern 530 and the second isolation pattern 532 may have different depths and/or different inner widths from each other.

In an embodiment, the first isolation pattern 530 may have a first depth. The second, isolation pattern 532 may have a second depth that is greater than the first depth. The first isolation pattern 530 may have a first volume. The second isolation pattern 532 may have a second volume that is greater than the first volume. In this embodiment, the tensile stress applied to the source region 522 may be greater than the tensile stress applied to the drain region 520. Therefore, a concentration of electric fields in the source region 522 may be decreased.

Figure 23:
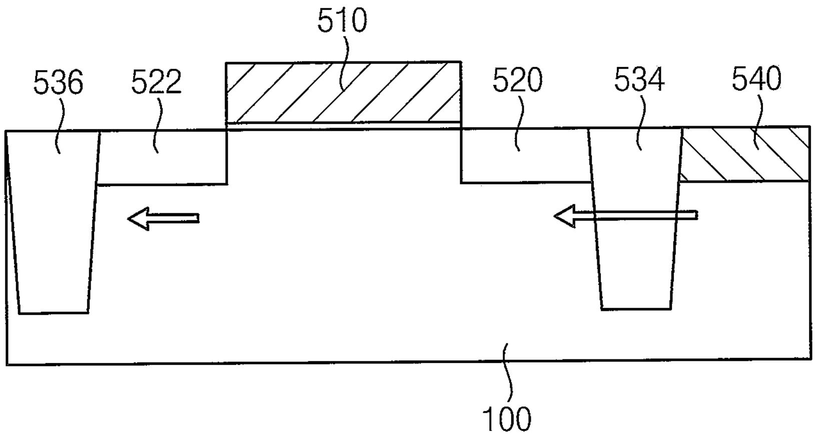

FIG. 23 is a cross-sectional view illustrating a high voltage power transistor in accordance with an embodiment of the present disclosure.

Referring to FIG. 23, the substrate 100 may include the active region and the isolation region. The isolation region may be a region in which an isolation pattern 534 and 536 is filled in each of trenches of the substrate 100. The active region may be surrounded by the isolation region.

The gate structure 510 may be disposed to cross the active region on the substrate 100. In an embodiment, the gate structure 510 may include a gate insulation layer, a gate electrode, and a capping layer pattern stacked (e.g., in the vertical direction).

In an embodiment, the gate structure 510 may have the same structure as the gate structure shown in FIG. 1 or FIG. 11 and a repeated description of similar or identical elements may be omitted for convenience of description. In an embodiment, a spacer may be further disposed on a sidewall of the gate structure 510.

The source region 522 and the drain region 520 may be disposed ire the active region adjacent to both sides of the gate structure 510.

In an embodiment, the drain region 520 may have the same structure as the drain region shown in FIG. 1, and the source region 522 may have the same structure as the source region shown in FIG. 1 and a repeated description of similar or identical elements may be omitted for convenience of description.

In some embodiments, as shown in FIG. 15, an additional impurity region may be further disposed at one side of the drain region 520.

Outer walls of edges of the source region 522 and the drain region 520 may directly contact the isolation patterns 536 and 534, respectively. A first isolation pattern 534 may directly contact the drain region 520, and a second isolation pattern 536 may directly contact the source region 522.

The first and second isolation patterns 534 and 536 may include an insulation material that applies a tensile stress to the substrate 100 adjacent thereto. In an embodiment, the first and second isolation patterns 534 and 536 may include silicon oxide. In an embodiment, the first and second isolation patterns 534 and 536 may have the same depth and the same volume as each other.

In an embodiment, a silicon germanium pattern 540 may be disposed on the substrate, and the silicon germanium pattern 540 may directly contact an upper portion of one sidewall of the first isolation pattern 534. For example, the silicon germanium pattern 540 may not be disposed on any sidewall of the second isolation pattern 536. However, embodiments of the present disclosure are not necessarily limited thereto and in an embodiment the silicon germanium pattern 540 may directly contact an upper portion of one sidewall of the second isolation pattern 536 and may not be disposed on any sidewall of the first isolation pattern 534. The silicon germanium pattern 540 may apply compressive stress to the substrate 100 adjacent thereto.

In this embodiment, the compressive stress may be applied to the drain region 520 by the silicon germanium pattern 540, and the tensile stress may be applied to the source region 522 by the second isolation pattern 536. For example, in an embodiment the tensile stress applied to the source region 522 may be greater than the tensile stress applied to the drain region 520, so that a concentration of electric fields in the source region 522 may be decreased.

Figure 24:
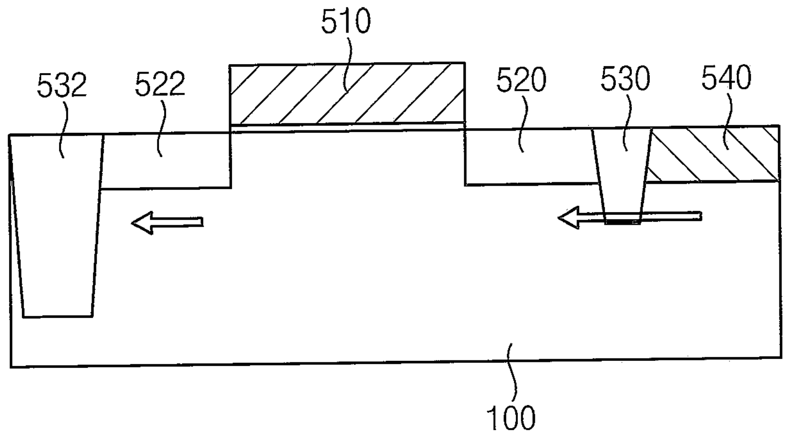

FIG. 24 is a cross-sectional view illustrating a high voltage power transistor according to an embodiment of the present disclosure.

The high voltage power transistor shown in FIG. 24 may be substantially the same as the high voltage power transistor shown in FIG. 22, except for a silicon germanium pattern 540 and a repeated description of similar or identical elements may be omitted for convenience of description.

Referring to FIG. 24, the silicon germanium pattern 540 may be further disposed on the substrate 100, and the silicon germanium pattern 540 may directly contact an upper portion of one sidewall of the first isolation pattern 530.

Therefore, the compressive stress may be applied to the drain region 520 by the silicon germanium pattern 540, and the tensile stress may be applied to the source region 522 by the second isolation pattern 532. Therefore, a concentration of electric fields in the source region 522 may be decreased.

Figure 25:
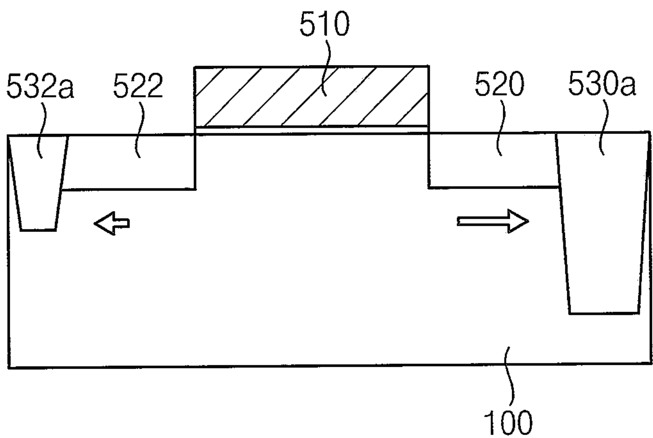

FIG. 25 is a cross-sectional view illustrating a high voltage power transistor in accordance with an embodiment of the present disclosure.

The high voltage power transistor shown in FIG. 25 may be substantially the same as the high voltage power transistor shown in FIG. 22, except for a position of the isolation pattern.

Referring to FIG. 25, the substrate 100 may include the active region and the isolation region. The gate structure 510 may be disposed to cross the active region on the substrate.

The source region 522 and the drain region 520 may be disposed in the active region adjacent to both sides of the gate structure 510.

Outer walls of edges of the source region 522 and the drain region 520 may directly contact isolation patterns 532*a* and 530*a*, respectively. A first isolation pattern 530*a* may directly contact the drain region 520, and a second isolation pattern 532*a* may directly contact the source region 522.

The first and second isolation patterns 530*a* and 532*a* may include an insulation material that applies a tensile stress to the substrate 100 adjacent thereto. In an embodiment, the first and second isolation patterns 530*a* and 532*a* may include silicon oxide. However, embodiments of the present disclosure are not necessarily limited thereto. Therefore, the tensile stress applied to the substrate 100 may be controlled by the first and second isolation patterns 530*a* and 532*a*.

In an embodiment, the first isolation pattern 530*a* may have a first depth. The second isolation pattern 532*a* may have a second depth that is less than the first depth. The first isolation pattern 530*a* may have a first volume. The second isolation pattern 532*a* may have a second volume that is less than the first volume. In an embodiment, the tensile stress applied to the drain region 520 is greater than the tensile stress applied to the source region 522. In this embodiment, a concentration of electric fields in the drain region 520 may be decreased.

Figure 26:
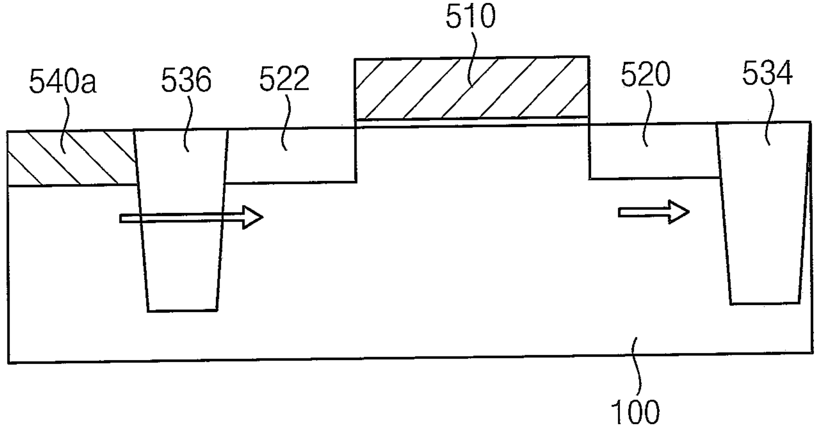

FIG. 26 is a cross-sectional view illustrating a high voltage power transistor in accordance with an embodiment of the present disclosure.

The high voltage power transistor shown in FIG. 26 may be substantially the same as the high voltage power transistor shown in FIG. 23, except for a position of the silicon germanium pattern and a repeated description of similar or identical elements may be omitted for convenience of description.

Referring to FIG. 26, outer walls of edges of the source region 522 and the drain region 520 may directly contact isolation patterns 536 and 534, respectively. A first isolation pattern 534 may directly contact the drain region 520, and a second isolation pattern 536 may directly contact the source region 522.

The first and second isolation patterns 534 and 536 may include an insulation material that applies a tensile stress to the substrate 100 adjacent thereto. In an embodiment, the first and second isolation patterns 534 and 536 may include silicon oxide. However, embodiments of the present disclosure are not necessarily limited thereto. Also, the first and second isolation patterns 534 and 536 may have the same depth and the same volume as each other.

A silicon germanium pattern 540*a* may be disposed on (e.g., directly on) the substrate 100. The silicon germanium pattern 540*a* may directly contact an upper portion of one sidewall of the second isolation pattern 536. In an embodiment, the silicon germanium pattern may not be disposed on an upper portion of one sidewall of the first isolation pattern 534. The silicon germanium pattern 540*a* may apply a compressive stress to the substrate 100 adjacent thereto.

In this embodiment, the compressive stress may be applied to the source region 522 by the silicon germanium pattern 540*a*, and the tensile stress may be applied to the drain region 520 by the first isolation pattern 534. For example, in an embodiment the tensile stress applied to the drain region 520 may be greater than the tensile stress applied to the source region 522, so that a concentration of electric fields in the drain region 520 may be decreased.

Figure 27:
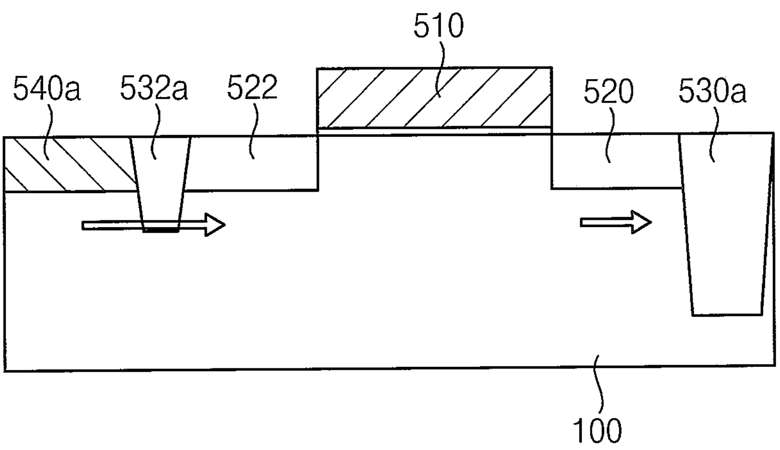

FIG. 27 is a cross-sectional view illustrating a high voltage power transistor in accordance with an embodiment of the present disclosure.

The high voltage power transistor shown in FIG. 27 may be substantially the same as the high voltage power transistor shown in FIG. 25, except for a silicon germanium pattern and a repeated description of similar or identical elements may be omitted for convenience of description.

Referring to FIG. 27, a silicon germanium pattern 540*a* may be further disposed on the substrate, and the silicon germanium pattern 540*a* may directly contact an upper portion of one sidewall of the second isolation pattern 532*a*.

Therefore, a compressive stress may be applied to the source region 522 by the silicon germanium pattern 540*a*, and a tensile stress may be applied to the drain region 520 by the first isolation pattern 530*a*. Thus, a concentration of electric fields in the drain region 520 may be decreased.

The foregoing is illustrative of example embodiments and is not to be construed as limiting thereof. Although a few non-limiting embodiments have been described, those skilled in the art will readily appreciate that many modifications are possible in the described embodiments without materially departing from the novel teachings and advantages of the present disclosure. Accordingly, all such modifications are intended to be included within the scope of the present disclosure.

What is claimed is:

1. A transistor, comprising:

a substrate having a bulk region including a P-type-sub region that is doped with P-type impurities;

a well region positioned at an upper portion of the substrate, the well region is doped with P-type impurities;

a gate structure on the well region; the gate structure including a gate insulation layer, a first conductive pattern for adjusting a threshold voltage; a second conductive pattern for adjusting a threshold voltage, and a gate electrode;

a drain region positioned at an upper portion of the substrate adjacent to a first sidewall of the gate structure; and a source region doped with N-type impurities and positioned at an upper portion of the substrate adjacent to a second sidewall of the gate structure, the second sidewall of the gate structure facing the first sidewall of the gate structure;

an additional impurity region protruding from one sidewall of the drain region towards the source region, wherein the additional impurity region is doped with N-type impurities, and is spaced apart from an upper surface of the substrate;

wherein the drain region includes a highly doped N-type impurity region; an N-type impurity region having a lower N-type impurity concentration than the highly doped N-type impurity region, and a lightly doped P-type impurity region sequentially disposed in a downward direction from a top surface of the substrate towards a bottom surface of the substrate, wherein a boundary between the well region and the P-type-sub region is positioned under a bottom of the drain region, and wherein a first portion of the lightly doped P-type impurity region of the drain region directly contacts the P-type-sub region, and a second portion of the lightly doped P-type impurity region of the drain region directly contacts the well region.

2. The transistor of claim 1, wherein:

the first and second conductive patterns for adjusting the threshold voltage are disposed on the gate insulation layer; and the first and second conductive patterns for adjusting the threshold voltage are directly connected to each other, wherein the first conductive pattern for adjusting the threshold voltage has a thickness that is different from a thickness of the second conductive pattern for adjusting the threshold voltage.

3. The transistor of claim 1, wherein:

the first and second conductive patterns for adjusting the threshold voltage are disposed on the gate insulation layer; and the first and second conductive patterns for adjusting the threshold voltage are directly connected to each other, wherein the first conductive pattern for adjusting the threshold voltage is positioned closer to the drain region, and the second conductive pattern for adjusting the threshold voltage is positioned closer to the source region.

4. The transistor of claim 3, wherein the second conductive pattern for adjusting the threshold voltage has a thickness that is greater than a thickness of the first conductive pattern for adjusting the threshold voltage.

5. The transistor of claim 1, wherein the first conductive patterns for adjusting the threshold voltage and the second conductive patterns for adjusting the threshold voltage are comprised of a same material as each other.

6. The transistor of claim 1, wherein the first and second conductive patterns for adjusting the threshold voltage include titanium, titanium nitride, tantalum, or tantalum nitride.

7. The transistor of claim 1, further comprising:

a contact plug contacting an upper surface of the gate electrode in the gate structure, and wherein a distance between the contact plug and the source region is less than a distance between the contact plug and the drain region.

8. The transistor of claim 1, further comprising:

a first isolation pattern directly contacting an outer wall of an edge of the drain region and a second isolation pattern directly contacting an outer wall of an edge of the source region, wherein a volume of the first isolation pattern and a volume of the second isolation pattern are different from each other.

9. The transistor of claim 1, further comprising:

a first isolation pattern directly contacting an outer wall of an edge of the drain region and a second isolation pattern directly contacting an outer wall of an edge of the source region; and a silicon germanium pattern directly contacting one of the first and second isolation patterns.

10. The transistor of claim 2, wherein uppermost portions of the first and second conductive patterns for adjusting the threshold voltage are coplanar with each other.

11. A transistor, comprising:

a substrate having a bulk region including a P-type-sub region that is doped with P-type impurities;

a well region positioned at an upper portion of the substrate, the well region is doped with P-type impurities;

an insulating interlayer on the substrate, the insulating interlayer including a gate trench exposing an upper surface of the well region;

a gate structure in the gate trench;

a drain region positioned at an upper portion of the substrate adjacent to a first sidewall of the gate structure, the drain region having a doping concentration of impurities that decreases in a downward direction from the upper surface of the substrate towards a bottom surface of the substrate; and a source region doped with N-type impurities and positioned at an upper portion of the substrate adjacent to a second sidewall of the gate structure, the second sidewall of the gate structure facing the first sidewall of the gate structure, an additional impurity region protruding from one sidewall of the drain region toward the source region, wherein the additional impurity region is doped with N-type impurities, and is spaced apart from the upper surface of the substrate;

wherein the gate structure comprises:

a gate insulation layer on a sidewall and a bottom of the gate trench;

a first conductive pattern for adjusting a threshold voltage on the gate insulation layer in a first portion of the gate trench, the first conductive pattern for adjusting the threshold voltage having a first thickness;

a second conductive pattern for adjusting a threshold voltage on the gate insulation layer in a second portion of the gate trench that is different from the first portion, the second conductive pattern for adjusting the threshold voltage having a second thickness that is different from the first thickness; and a gate electrode on the first and second conductive patterns for adjusting the threshold voltage, wherein a boundary between the well region and the P-type-sub region is positioned under a bottom of the drain region, and wherein a first bottom portion of the drain region directly contacts the P-type-sub region, and a second bottom portion of the drain region directly contacts the well region.

12. The transistor of claim 11, wherein one end of each of the first and second conductive patterns for adjusting the threshold voltage is directly connected to each other, wherein the first conductive pattern for adjusting the threshold voltage is positioned closer to a first drain region, and the second conductive pattern for adjusting the threshold voltage is positioned closer to the source region.

13. The transistor of claim 12, wherein the second conductive pattern for adjusting the threshold voltage has a thickness that is greater than a thickness of the first conductive pattern for adjusting the threshold voltage.

14. The transistor of claim 11, wherein the drain region includes an N-type impurity region positioned at an upper portion and a P-type impurity region positioned at a lowermost portion.

15. The transistor of claim 11, wherein the drain region includes a highly doped N-type impurity region, an N-type impurity region having a lower N-type impurity concentration than the highly doped N-type impurity region, and a lightly doped P-type impurity region sequentially disposed in the downward direction.

16. The transistor of claim 11, wherein uppermost portions of the first and second conductive patterns for adjusting the threshold voltage are coplanar with each other.

17. A transistor, comprising:

active fins protruding from a substrate;

an isolation pattern filling a lower portion between the active fins;

a P-type-sub region in each of the active fins, the P-type-sub region doped with P-type impurities;

a well region at an upper portion of each of the active fins, the well region doped with P-type impurities;

a gate structure on surfaces of the active fins on the well region, the gate structure including a gate insulation layer, a first conductive pattern for adjusting a threshold voltage, a second conductive pattern for adjusting a threshold voltage, and a gate electrode;

each of the active fins includes a drain region adjacent to a first sidewall of the gate structure; and each of the active fins includes a source region doped with N-type impurities and positioned adjacent to a second sidewall of the gate structure, the second sidewall of the gate structure facing the first sidewall of the gate structure, wherein the drain region includes a highly doped N-type impurity region, an N-type impurity region having a lower N-type impurity concentration than the highly doped N-type impurity region, and a lightly doped P-type impurity region sequentially disposed in a downward direction from a top of the active fin towards a bottom surface of the active fin, wherein a boundary between the well region and the P-type-sub region is positioned under a bottom portion of the drain region, and wherein a first portion of the lightly doped P-type impurity region of the drain region directly contacts the P-type-sub region, and a second portion of the lightly doped P-type impurity region of the drain region directly contacts the well region.

18. The transistor of claim 17, wherein:

the first and second conductive patterns for adjusting the threshold voltage are disposed on the gate insulation layer; and the first and second conductive patterns for adjusting the threshold voltages are directly connected to each other, wherein the first conductive pattern for adjusting the threshold voltage has a thickness that is different from a thickness of the second conductive pattern for adjusting the threshold voltage.

* * * * *